(12) United States Patent
Zhang

(10) Patent No.: US 11,956,941 B2
(45) Date of Patent: Apr. 9, 2024

(54) MANUFACTURING METHOD FOR MEMORY

(71) Applicant: CHANGXIN MEMORY TECHNOLOGIES, INC., Hefei (CN)

(72) Inventor: Jiayun Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/607,768

(22) PCT Filed: Jun. 17, 2021

(86) PCT No.: PCT/CN2021/100586
§ 371 (c)(1),
(2) Date: Oct. 29, 2021

(87) PCT Pub. No.: WO2022/160568
PCT Pub. Date: Aug. 4, 2022

(65) Prior Publication Data
US 2023/0363137 A1 Nov. 9, 2023

(30) Foreign Application Priority Data
Jan. 29, 2021 (CN) .......................... 202110128863.7

(51) Int. Cl.
*H10B 12/00* (2023.01)
(52) U.S. Cl.
CPC .................................. *H10B 12/09* (2023.02)
(58) Field of Classification Search
None
See application file for complete search history.

(56) References Cited

U.S. PATENT DOCUMENTS

| 6,346,366 B1 * | 2/2002 | Chu ...................... H10B 12/09 |
| | | 257/E21.654 |
| 7,291,560 B2 * | 11/2007 | Parascandola ...... H01L 21/0337 |
| | | 438/689 |
| 2020/0219889 A1 * | 7/2020 | Lin ....................... H01L 21/761 |

FOREIGN PATENT DOCUMENTS

| CN | 107437497 B | 11/2019 |
| CN | 110690197 A | 1/2020 |
| CN | 111403276 A | 7/2020 |

(Continued)

OTHER PUBLICATIONS

International Search Report (ISR) in international application No. PCT/CN2021/100586 dated Oct. 28, 2021.

*Primary Examiner* — Michelle Mandala
*Assistant Examiner* — Jordan M Klein
(74) *Attorney, Agent, or Firm* — Syncoda LLC; Feng Ma

(57) ABSTRACT

A manufacturing method for memory includes providing a substrate; forming a first isolation layer on the substrate; forming a first mask layer on the first isolation layer; forming a second isolation layer on the first mask layer and part of the first isolation layer; forming a second mask layer on the second isolation layer; removing part of the second mask layer and part of the second isolation layer; removing the first mask layer and the remaining second mask layer; forming a third mask layer on the first isolation layer and the remaining second isolation layer; removing part of the third mask layer; and etching the remaining part of the second isolation layer and the first isolation layer below the second isolation layer, by taking the remaining third mask layer as a mask.

20 Claims, 28 Drawing Sheets

(56) References Cited

FOREIGN PATENT DOCUMENTS

CN 112786536 A 5/2021
KR 20100044554 A 4/2010

* cited by examiner

MANUFACTURING METHOD FOR MEMORY

CROSS-REFERENCE TO RELATED APPLICATIONS

This application is a national stage of International Application No. PCT/CN2021/100586 filed on Jun. 17, 2021, which claims priority to Chinese Patent Application No. 202110128863.7 filed on Jan. 29, 2021. The disclosures of these applications are hereby incorporated by reference in their entirety.

TECHNICAL FIELD

The present application relates to a semiconductor integrated circuit manufacturing technology, and in particular, to a manufacturing method for memory.

BACKGROUND

A dynamic random access memory (DRAM) is a semiconductor memory that writes and reads data rapidly and randomly, and is widely used in data storage devices or apparatuses.

The DRAM includes a substrate and a plurality of isolation walls arranged on the substrate. The substrate and the plurality of isolation walls on the substrate are constituent structures in the DRAM.

However, the isolation walls have structural defects, which will lead to poor performance of the memory.

SUMMARY

In view of the above problem, the present application provides a manufacturing method for memory to solve the problem of poor memory performance.

In order to achieve the above objective, an embodiment of the present application provides the following technical solution:

An embodiment of the present application provides a manufacturing method for memory, including the following steps: providing a substrate, the substrate including a first functional region and a second functional region; forming a first isolation layer on the substrate; forming a first mask layer with pattern regions on the first isolation layer, the pattern region including a first pattern region corresponding to the first functional region and a second pattern region corresponding to the second functional region, the first pattern region including a plurality of first mask walls and first trenches formed between the adjacent first mask walls, and the second pattern region including a plurality of second mask walls and second trenches formed between the adjacent second mask walls; forming a second isolation layer on the first mask layer and on the first isolation layer exposed in the first trenches and the second trenches, the second isolation layer forming third trenches in the first trenches and fourth trenches in the second trenches; forming a second mask layer on the second isolation layer, the second mask layer filling the third trenches and the fourth trenches and covering a top surface of the second isolation layer, and the second mask layer having a first recessed portion corresponding to the first pattern region and a second recessed portion corresponding to the second pattern region; removing part of the second mask layer and part of the second isolation layer, a top surface of a remaining second isolation layer being flush with a top surface of the first mask layer, and a top surface of the remaining second mask layer being equal to or smaller than the top surface of the first mask layer and larger than a top surface of the first isolation layer; removing the first mask layer and the remaining second mask layer; forming a third mask layer on the first isolation layer and the remaining second isolation layer; removing part of the third mask layer, a top surface of a remaining third mask layer being flush with the top surface of the remaining second isolation layer; and etching the remaining part of the second isolation layer and the first isolation layer below the second isolation layer, by taking the remaining third mask layer as a mask, and forming a first functional pattern corresponding to the first functional region and a second functional pattern corresponding to the second functional region.

In the manufacturing method for memory according to the embodiment of the present application, a first isolation layer is formed on a substrate, a first mask layer having first trenches and second trenches is formed on the first isolation layer, a second isolation layer is formed on the first mask layer and the first isolation layer that is not covered by the first mask layer, the second isolation layer forms third trenches in the corresponding first trenches and fourth trenches in the corresponding second trenches, a second mask layer is formed on the second isolation layer in the third trenches and the fourth trenches, then part of the second mask layer and part of the second isolation layer are removed, the first mask layer and the remaining second mask layer are removed, a third mask layer is formed on the first isolation layer and the second isolation layer, part of the third mask layer is removed such that the top surface of the third mask layer is flush with the top surface of the remaining second isolation layer, and the remaining second isolation layer and the first isolation layer below the second isolation layer are etched taking the remaining third mask layer as a mask, and a first functional pattern and a second functional pattern with complete pattern structures are formed on the first isolation layer, thereby improving the performance of the memory.

In some embodiments, the step of forming a first mask layer with pattern regions on the first isolation layer includes: forming a first mask embryo layer on the first isolation layer; forming a photoresist layer on the first mask embryo layer; patterning the photoresist layer; and etching part of the first mask embryo layer based on the patterned photoresist layer, and forming a first mask layer with pattern regions.

In some embodiments, when part of the first mask embryo layer is etched based on the patterned photoresist layer, a first isolation layer within a set depth is also etched and removed, where the set depth is defined as L.

In some embodiments, the set depth L is equal to a thickness D of the second isolation layer.

In some embodiments, after forming a first mask embryo layer on the first isolation layer and before arranging the photoresist layer on the first mask embryo layer, the manufacturing method for memory further includes: forming a dielectric anti-reflective coating on the first mask embryo layer.

In some embodiments, the material of the dielectric anti-reflective coating is silicon oxynitride.

In some embodiments, the first mask layer and the remaining second mask layer are removed by oxygen plasma etching.

In some embodiments, the first functional region includes a storage region, and a semiconductor structure formed on the storage region is used for charge storage and charge release.

In some embodiments, the second functional region includes a test region, and a semiconductor structure formed on the test region is used for electrical testing of the semiconductor structure formed on the storage region during the manufacturing process.

In some embodiments, the second pattern region includes a test pattern region corresponding to the test region, and the test pattern region includes a plurality of test mask walls and test trenches formed between the adjacent test mask walls.

In some embodiments, the second functional region further includes an alignment region, and a semiconductor structure formed on the alignment region is used to align the semiconductor structures formed on the storage region and the test region during exposure.

In some embodiments, the second pattern region further includes an alignment pattern region corresponding to the alignment region, at least one sub-pattern region is formed in the alignment pattern region, a plurality of sub-mask walls arranged at intervals and sub-trenches formed by every two adjacent sub-mask walls are formed in each sub-pattern region, a width of the sub-trenches is less than a width of the test trenches, and a pattern density of the sub-trenches on the sub-pattern region is greater than a pattern density of the test trenches on the test pattern region.

In some embodiments, the number of sub-pattern regions is four, each sub-pattern region is rectangular, and the four sub-pattern regions are arranged in a matrix of two rows and two columns, and the four sub-pattern regions are rotationally symmetrical around a center of the matrix of the four sub-pattern regions.

In some embodiments, a plurality of storage regions are formed on the substrate; cutting regions for separating the plurality of storage regions are further formed on the substrate, and the cutting regions are used to cut the substrate into a plurality of storage units after forming semiconductor structures on the substrate; and the alignment regions are formed on the cutting regions.

In some embodiments, the remaining part of the second isolation layer and the first isolation layer below the second isolation layer are etched taking the remaining third mask layer as a mask, by means of plasma etching based on a mixed gas of hexafluorobutadiene and oxygen.

In addition to the technical problems solved by the embodiments of the present application, the technical features constituting the technical solutions, and the beneficial effects brought about by the technical features of these technical solutions as described above, other technical problems that can be solved by the manufacturing method for memory according to the present application, other technical features included in the technical solutions, and the beneficial effects brought by these technical features will be further described in detail in specific implementations.

BRIEF DESCRIPTION OF THE DRAWINGS

To describe the technical solutions of the embodiments of the present application more clearly, the following briefly introduces the accompanying drawings required for describing the embodiments. Apparently, the accompanying drawings in the following description show some embodiments of the present application, and a person skilled in the art may still derive other drawings from these accompanying drawings without creative efforts.

REFERENCE NUMERALS

| | |
|---|---|
| 100: substrate; | 101: storage region; |
| 102: test region; | 103: alignment region; |
| 200: first isolation layer; | 201: metal tungsten layer; |
| 202: amorphous carbon layer; | 203: spin-on hard masks layer; |
| 204: silicon oxynitride layer; | 300: first mask layer; |
| 301: first mask wall; | 302: first trench; |
| 303: test mask wall; | 304: test trench; |
| 305: sub-pattern region; | 306: sub-mask wall; |
| 307: sub-trench; | 308: first mask embryo layer; |
| 309: photoresist layer; | 310: dielectric anti-reflective coating; |
| 400: second isolation layer; | 500: second mask layer; |
| 600: third mask layer. | |

DETAILED DESCRIPTION

A dynamic random access memory (DRAM) is a semiconductor memory that writes and reads data rapidly and randomly, and is widely used in data storage devices or apparatuses. The DRAM includes a substrate and a plurality of isolation walls disposed on the substrate. The substrate and the plurality of isolation walls on the substrate are constituent structures in the DRAM.

Figure 1A:
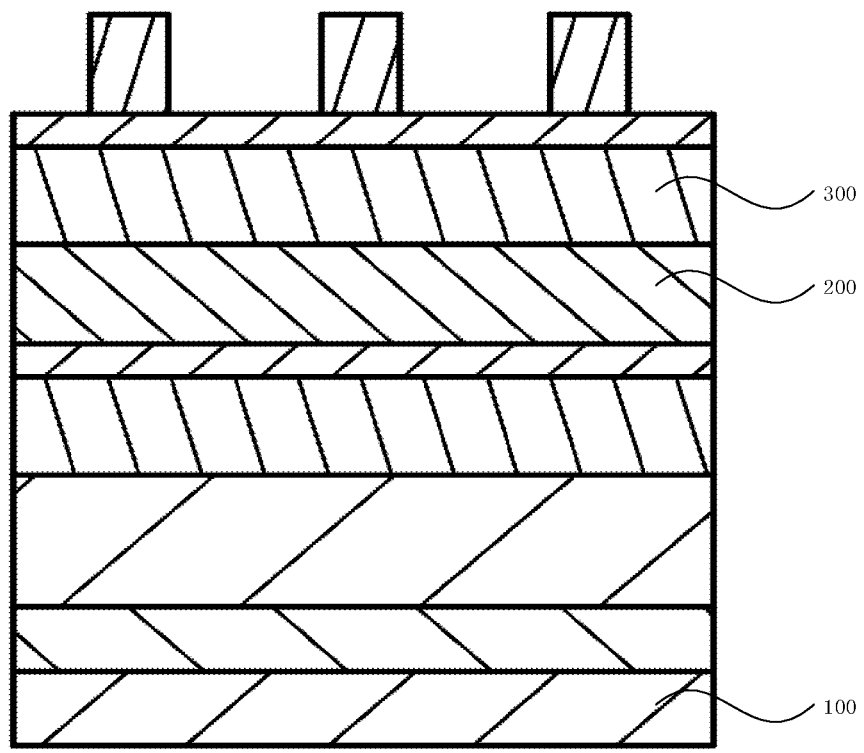
FIG. 1A is a schematic structure diagram after a photoresist on a storage region is patterned in related technologies.
Figure 1B:
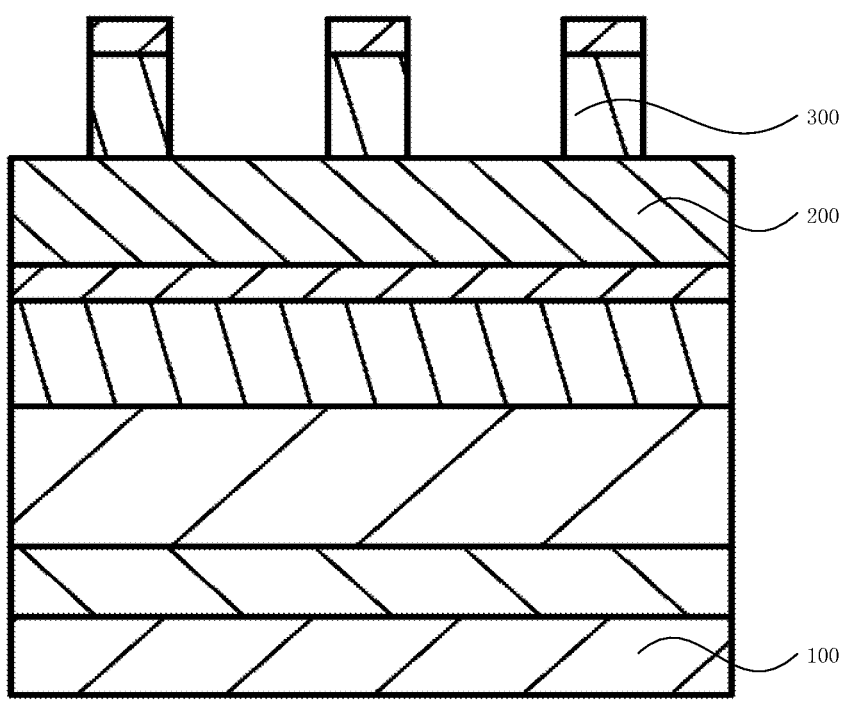
FIG. 1B is a schematic structure diagram illustrating that a first mask layer with pattern regions is arranged on the storage region in related technologies.
Figure 1C:
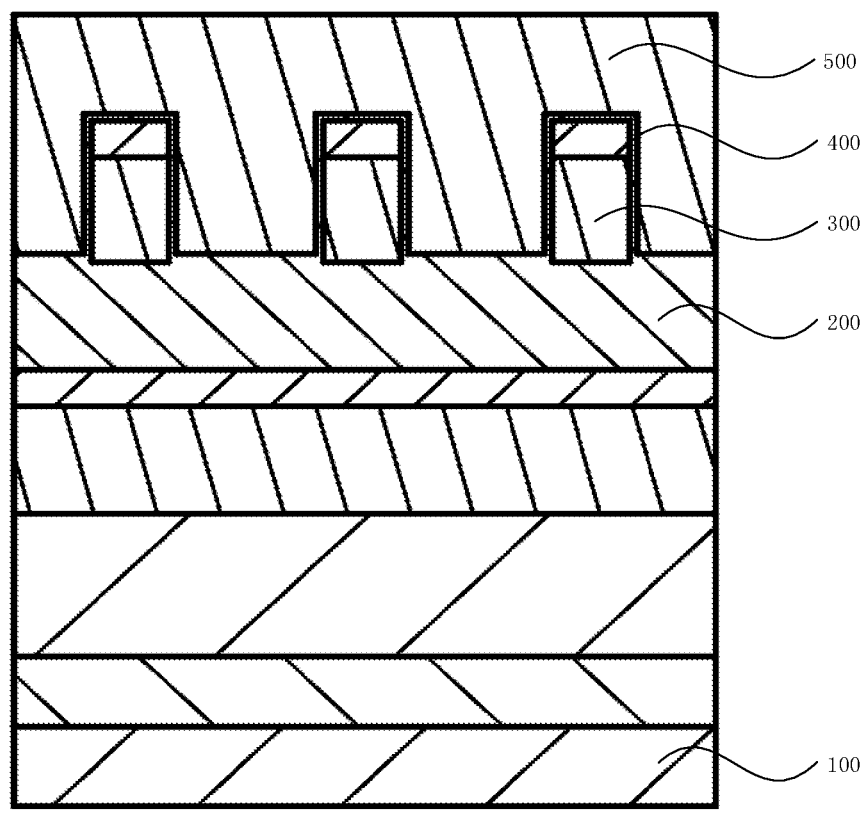
FIG. 1C is a schematic structure diagram illustrating that a second isolation layer and a second mask layer are disposed on the storage region in related technologies.
Figure 1D:
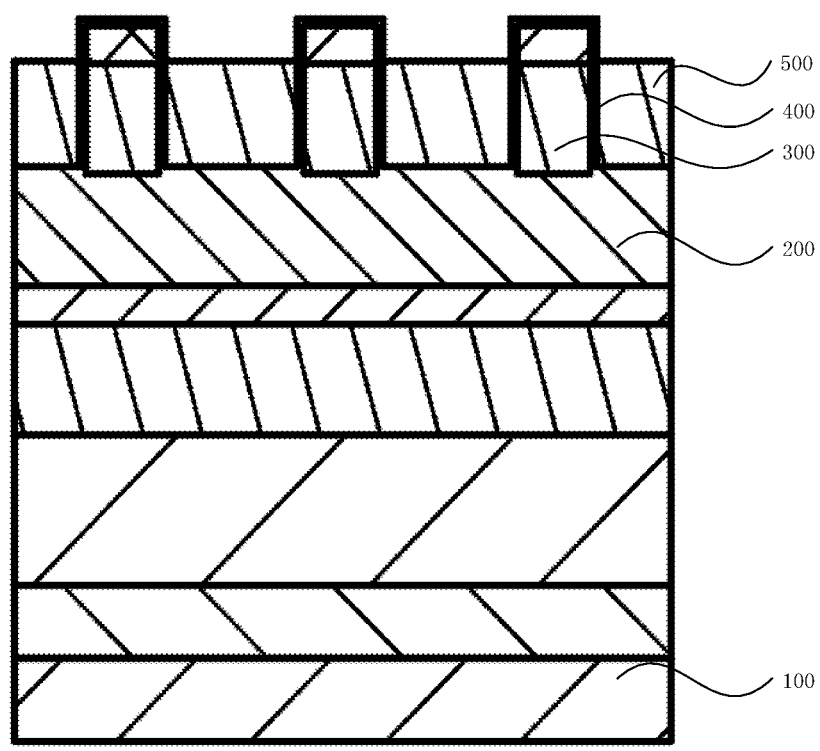
FIG. 1D is a schematic structure diagram illustrating that part of the second mask layer is removed from the storage region in related technologies.
Figure 1E:
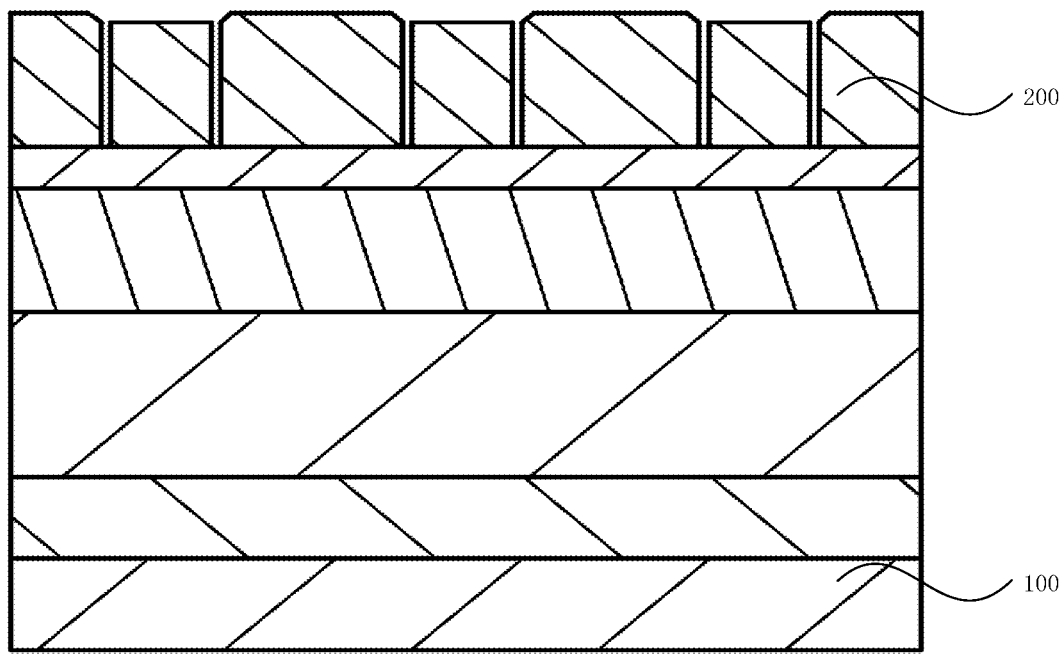
FIG. 1E is a schematic structure diagram after part of the second isolation layer, the first mask layer, and the second mask layer are removed from the storage region in related technologies.
Figure 2A:
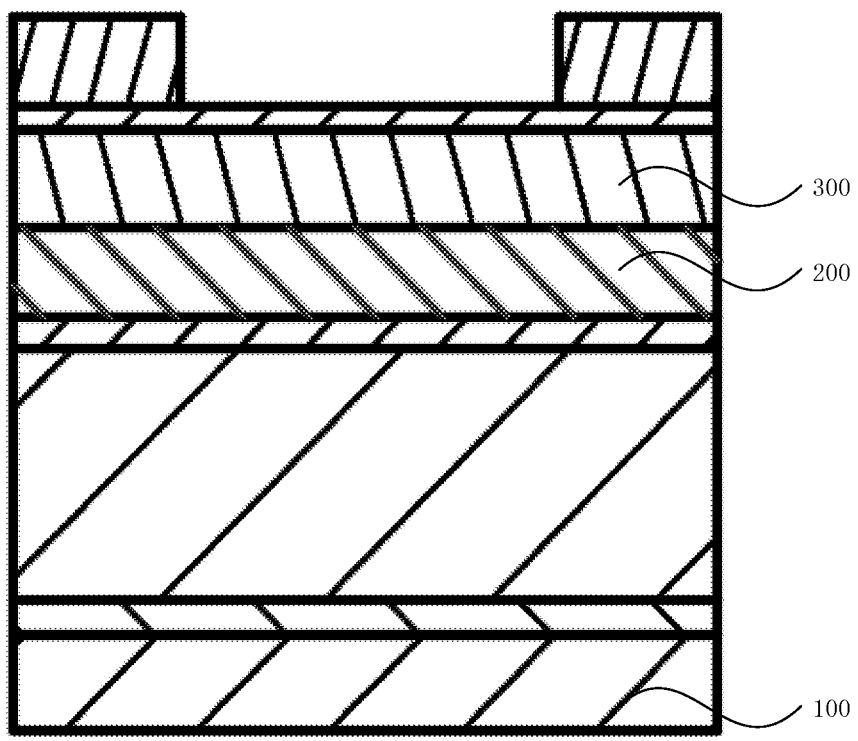
FIG. 2A is a schematic structure diagram after a photoresist on a test region is patterned in related technologies.
Figure 2B:
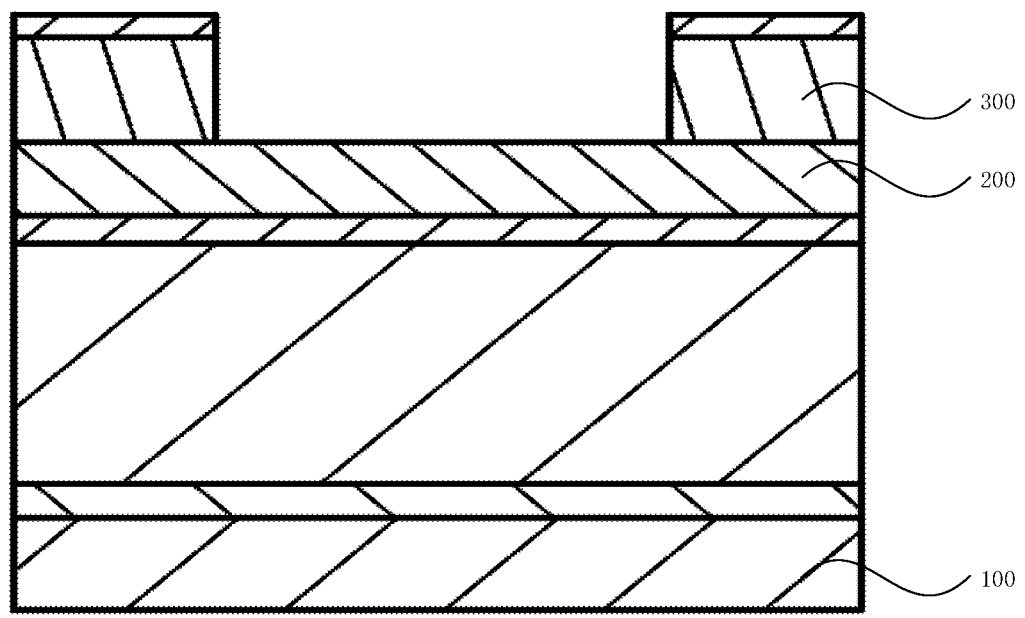
FIG. 2B is a schematic structure diagram illustrating that a first mask layer with pattern regions is arranged on the test region in related technologies.
Figure 2C:
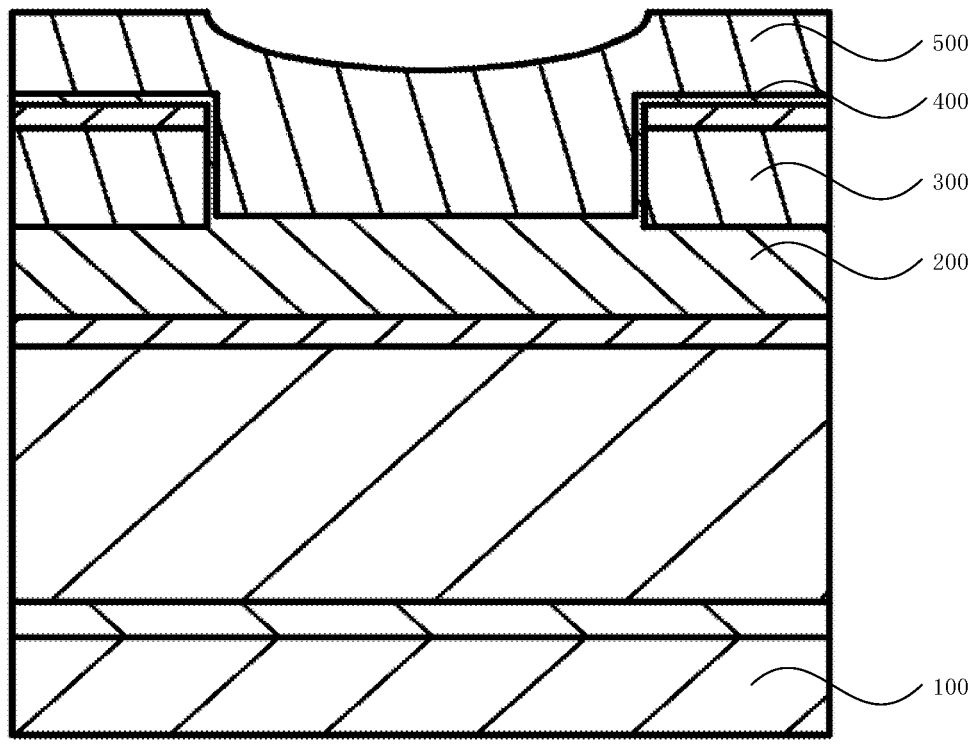
FIG. 2C is a schematic structure diagram illustrating that a second isolation layer and a second mask layer are disposed on the test region in related technologies.
Figure 2D:
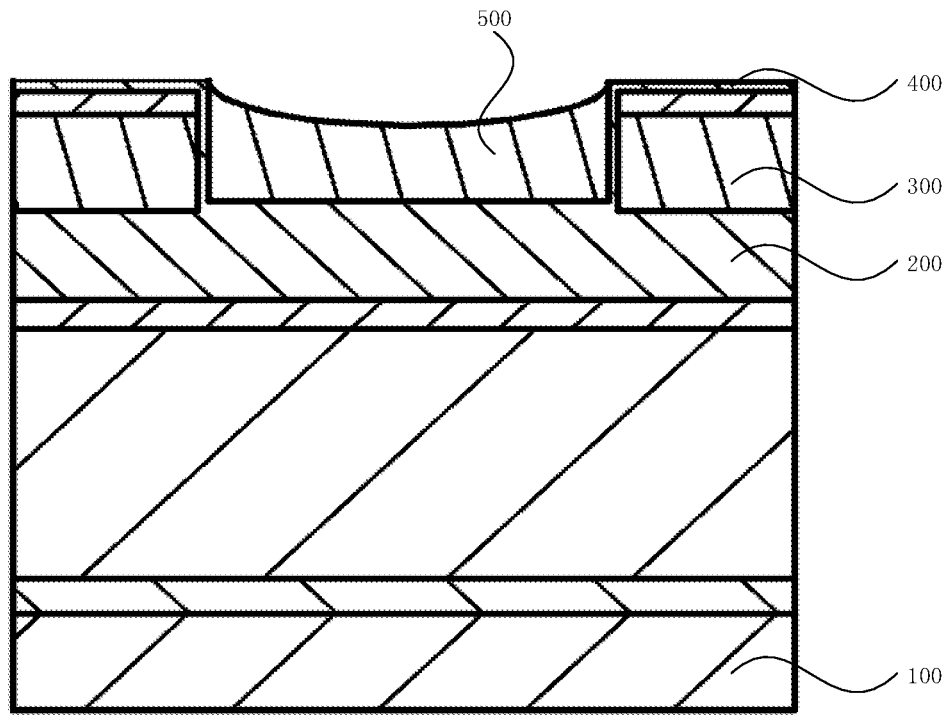
FIG. 2D is a schematic structure diagram illustrating that part of the second mask layer is removed from the test region in related technologies.
Figure 2E:
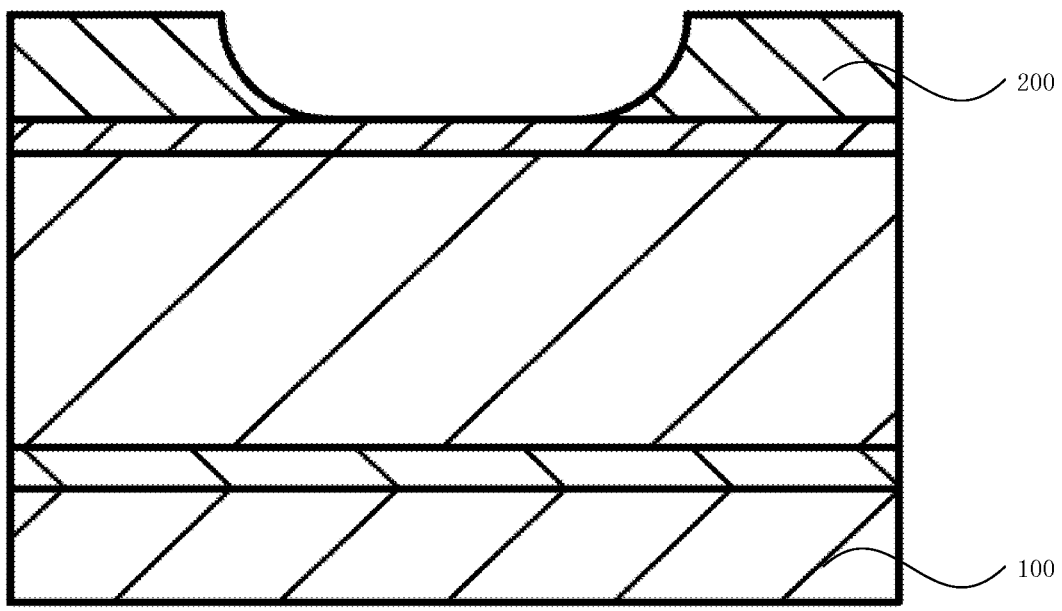
FIG. 2E is a schematic structure diagram after part of the second isolation layer, the first mask layer, and the second mask layer are removed from the test region in related technologies.
Figure 3A:
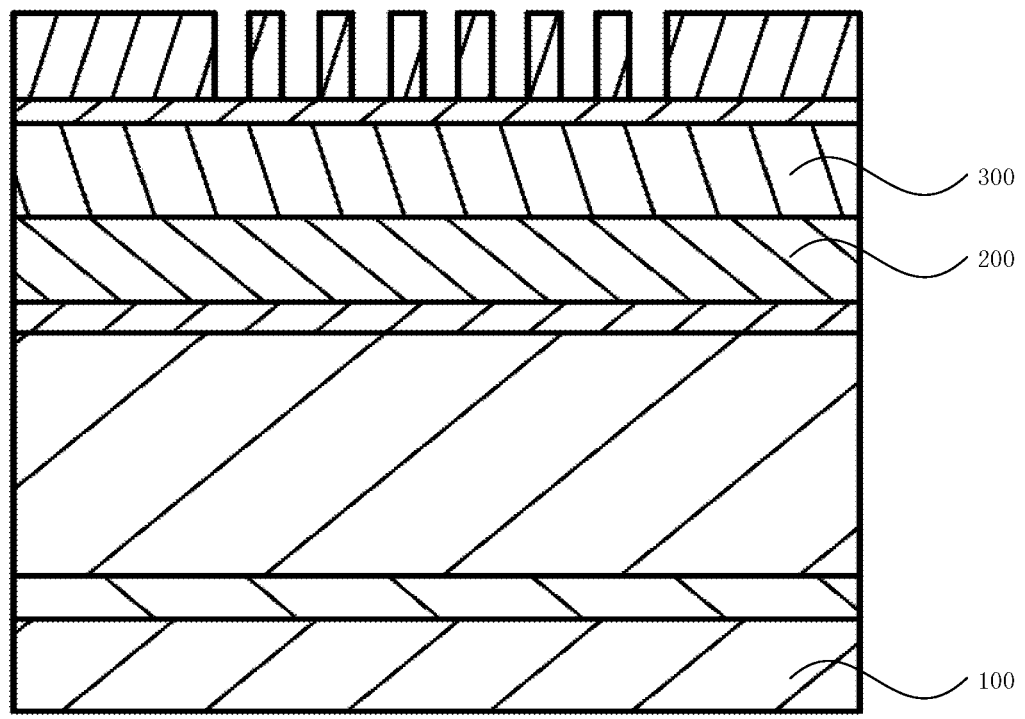
FIG. 3A is a schematic structure diagram after a photoresist on an alignment region is patterned in related technologies.
Figure 3B:
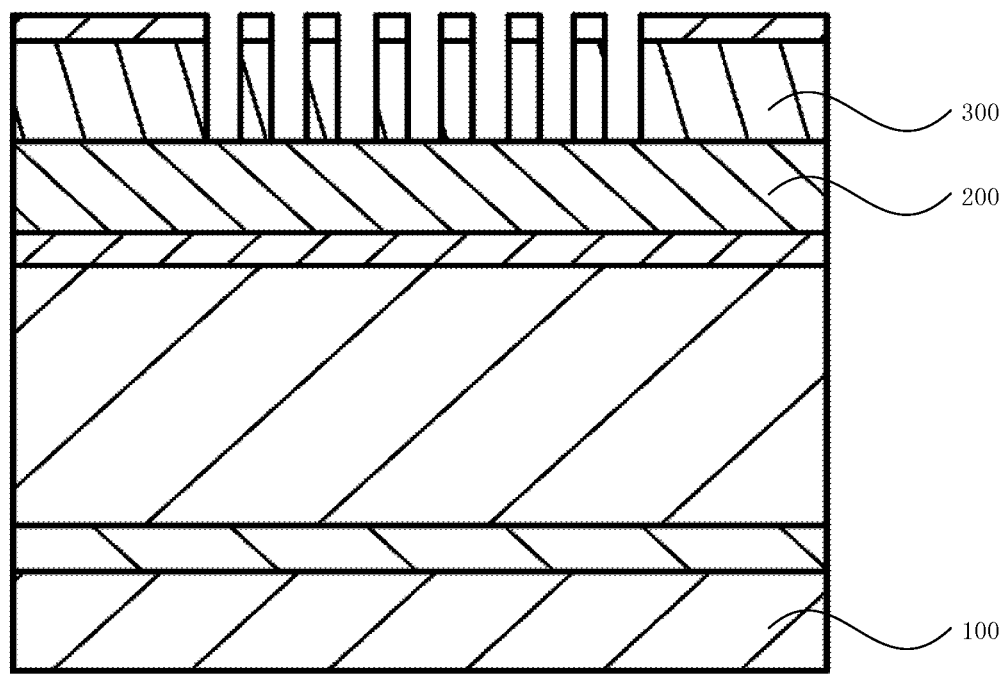
FIG. 3B is a structural schematic diagram illustrating that a first mask layer with pattern regions is arranged on the alignment region in related technologies.
Figure 3C:
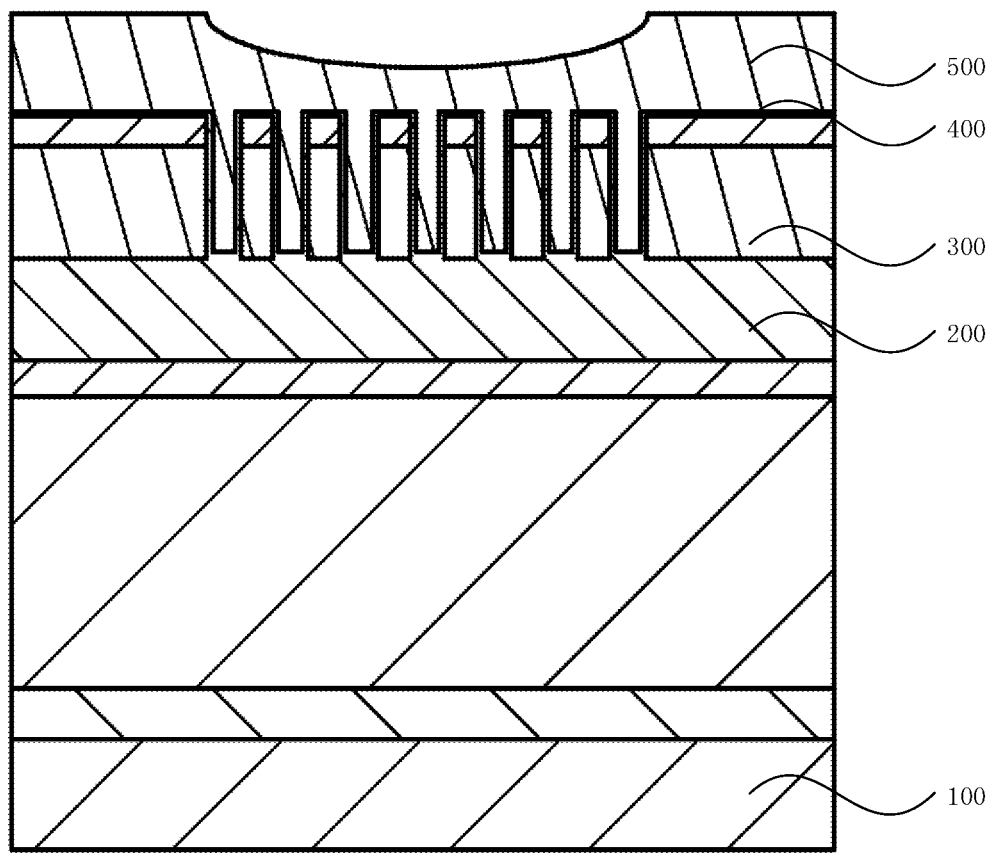
FIG. 3C is a schematic structure diagram illustrating that a second isolation layer and a second mask layer are disposed on the alignment region in related technologies.
Figure 3D:
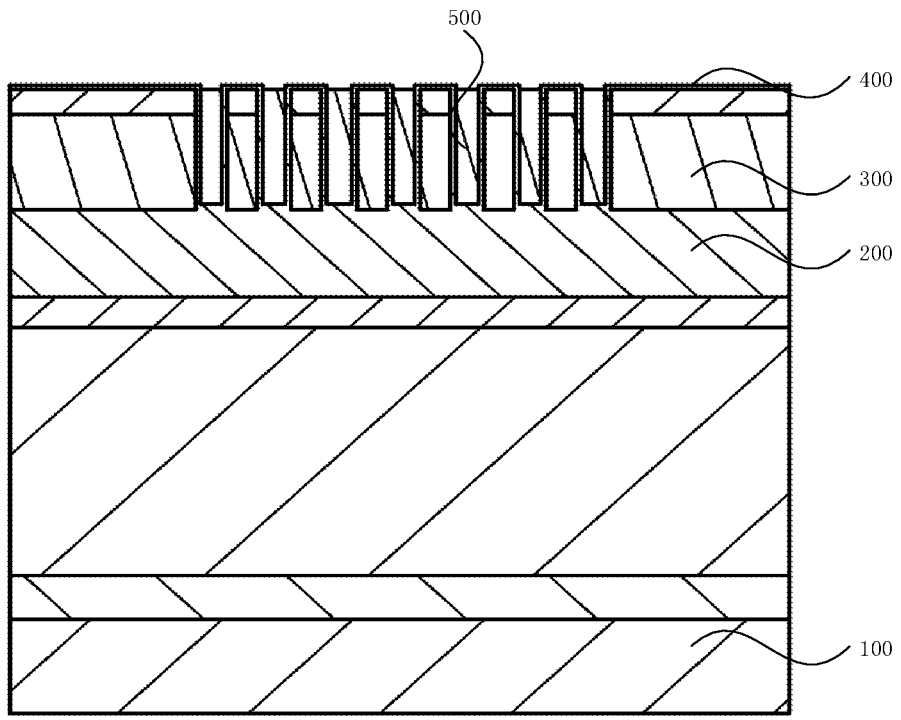
FIG. 3D is a schematic structure diagram illustrating that part of the second mask layer is removed from the alignment region in related technologies.
Figure 3E:
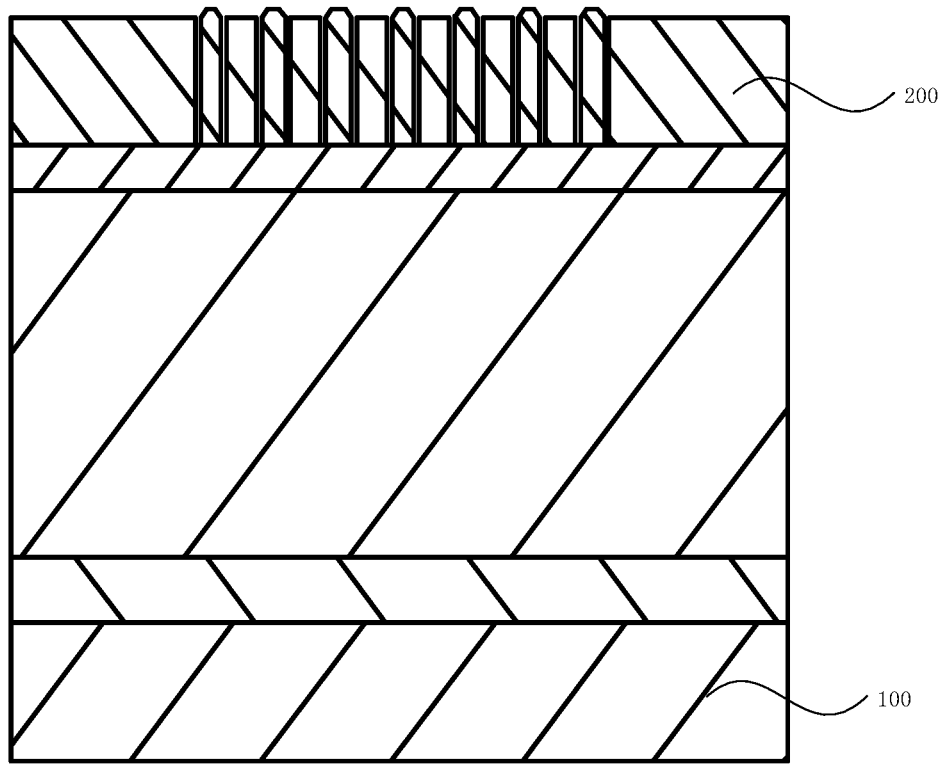
FIG. 3E is a schematic structure diagram after part of the second isolation layer, the first mask layer, and the second mask layer are removed from the alignment region in related technologies.

In some related technologies, a method for manufacturing isolation walls on a substrate is: providing a substrate, the substrate including a storage region, a test region and an alignment region; forming a first isolation layer on the substrate, the structure formed by the two steps being shown in FIGS. 1A, 2A and 3A, the substrate 100 including a storage region, a test region and an alignment region, and a first isolation layer 200 being disposed on the substrate 100; forming a first mask layer 300 with pattern regions on the first isolation layer 200, the pattern region including a first pattern region corresponding to the storage region, a second pattern region corresponding to the test region, and a third pattern region corresponding to the alignment region, all of the first pattern region, the second pattern region and the third pattern region being provided with first mask layer trenches, the structure formed in this step being shown in FIGS. 1B, 2B and 3B, and the first mask layer 300 being provided with first mask layer trenches; forming a second isolation layer on the first mask layer 300 and on the first isolation layer 200 exposed in the first mask layer trenches, the second isolation layer forming second mask layer trenches in the first mask layer trenches, the structure formed in this step being shown in FIGS. 1C, 2C and 3C, and the second isolation layer 400 being disposed on the first mask layer 300 and on the first isolation layer 200 in the first mask layer trenches; forming a second mask layer on the second isolation layer 400, the second mask layer filling the second mask layer trenches and covering a top surface of the second isolation layer 400, the second mask layer having a first recessed portion corresponding to the first pattern region, a second recessed portion corresponding to the second pattern region, and a third recessed portion corresponding to the third pattern region, the structure formed in this step being shown in FIGS. 1C, 2C and 3C, and the second mask layer 500 covering the second isolation layer 400 and filling the second mask layer trenches; removing part of the second mask layer 500, a top surface of the remaining second mask layer 500 being lower than the top surface of the second isolation layer 400, the structure formed in this step being shown in FIGS. 1D, 2D and 3D, the remaining second mask layer 500 being lower than the top surface of the second isolation layer 400 in the storage region, the remaining second mask layer 500 being lower than the top surface of the second isolation layer 400 in the test region and the alignment region; and taking the remaining first mask layer 300 and the remaining second mask layer 500 as masks, etching the second isolation layer 400 and the first isolation layer 200 below the second isolation layer, and forming isolation walls, the structure formed in this step being shown in FIGS. 1E, 2E and 3E. In this structure, the structure of the isolation walls formed in the storage region is substantially complete, but the structures of the isolation walls formed in the test region and the alignment region are over-etched. As a result, the isolation walls form patterns, and after the patterns are transferred to a metal layer between the substrate and the first isolation layer, the pattern structure of the metal layer has defects, so that the performance of the memory is poor.

In order to solve the above problem of over-etching in the test region and the alignment region, the inventor of the present application tried to solve the problem of over-etching by reducing the etching depth. However, because the storage region, the test region and the alignment region are etched at the same time, when the etching depth is reduced, bottoms of the adjacent isolation walls are connected, which will increase the probability of subsequent exposure and alignment failure. Therefore, this method is not feasible.

Finally, in order to solve the above problem of structural defects of the isolation walls, an embodiment of the present application provides a manufacturing method for memory, in which part of the second mask layer 500 is removed, the remaining second mask layer 500 and the first mask layer 300 are removed, a third mask layer 600 is formed on the first isolation layer 200 and part of the second isolation layer 400, part of the third mask layer 600 is removed, and the remaining third mask layer 600 is used as a mask to remove part of the second isolation layer 400 and part of the first isolation layer 200 so as to form an isolation layer. As such, after part of the second mask layer 500 is removed, the second mask layer 500 and the first mask layer 300 are directly removed, the third mask layer 600 is formed, then the third mask layer 600 is used as a mask, and the third mask hardly forms recesses at the trenches, so that when the first isolation layer 200 and the second isolation layer 400 are removed taking the third mask layer as a mask, over-etching will not be caused, the structure of the isolation walls will be complete, and the performance of the memory will be good.

To make the above objectives, features, and advantages of the embodiments of the present application more obvious and understandable, the following clearly and completely describes the technical solutions in the embodiments of the present application with reference to the accompanying drawings in the embodiments of the present application. Apparently, the described embodiments are some but not all of the embodiments of the present application. All other embodiments obtained by those of ordinary skill in the art without any creative efforts based on the embodiments of the present application shall fall within the protection scope of the present application. The embodiments or implementations in this specification are described in a progressive manner, each embodiment focuses on the differences from other embodiments, and the same or similar parts between the various embodiments may be referred to each other.

Figure 4A:
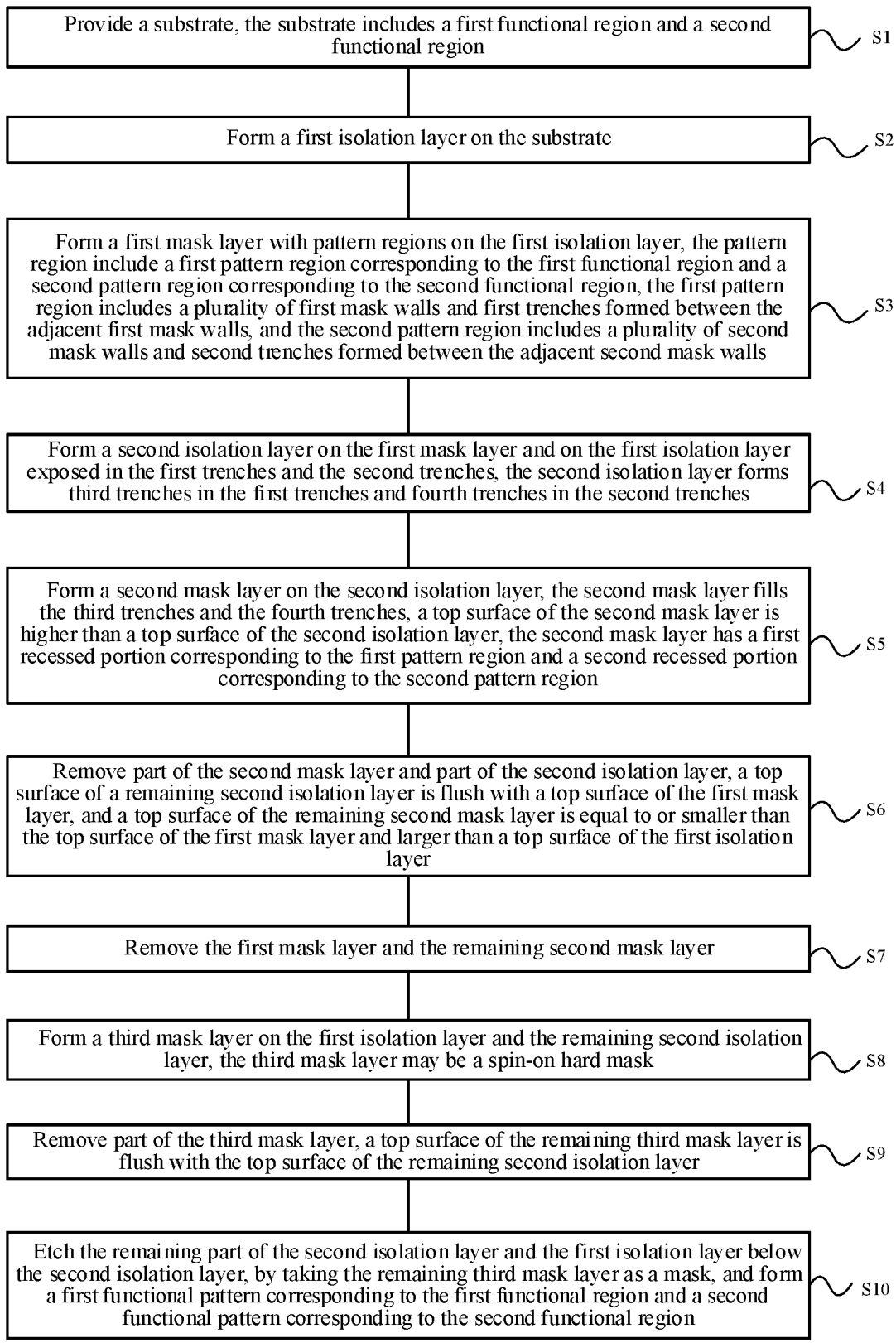
FIG. 4A is a flowchart of a manufacturing method for memory in an embodiment of the present application.
Figure 4B:
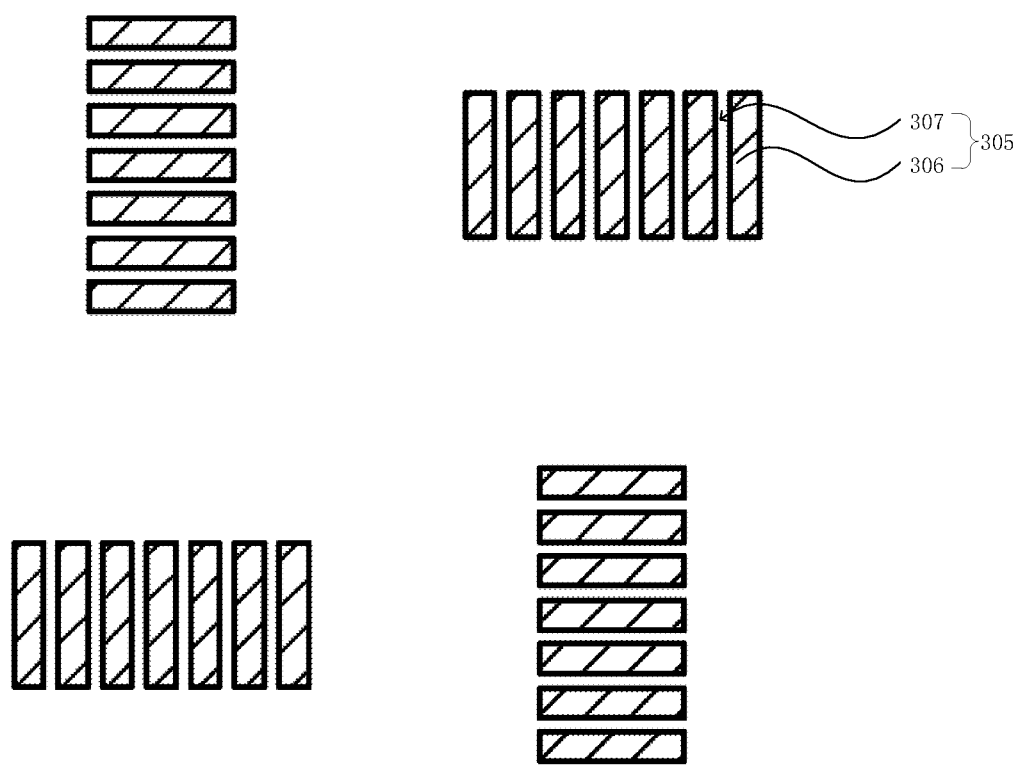
FIG. 4B is a schematic structure diagram of an alignment region in an embodiment of the present application.
Figure 4C:
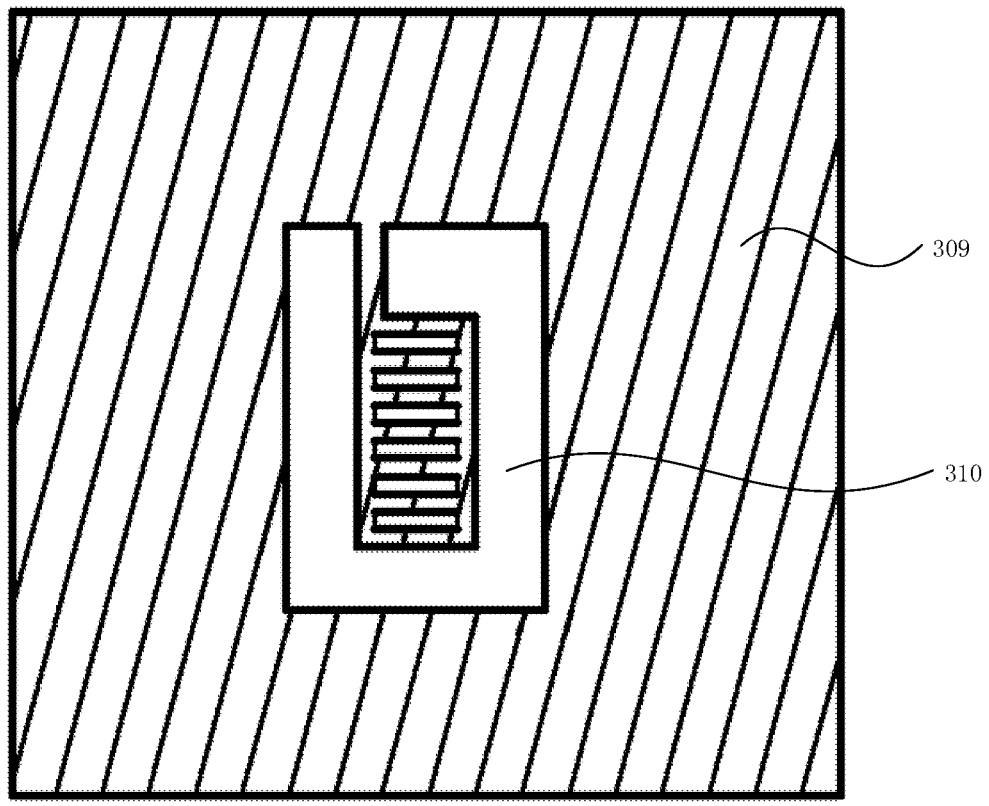
FIG. 4C is a schematic structure diagram of a test region in an embodiment of the present application.
Figure 5A:
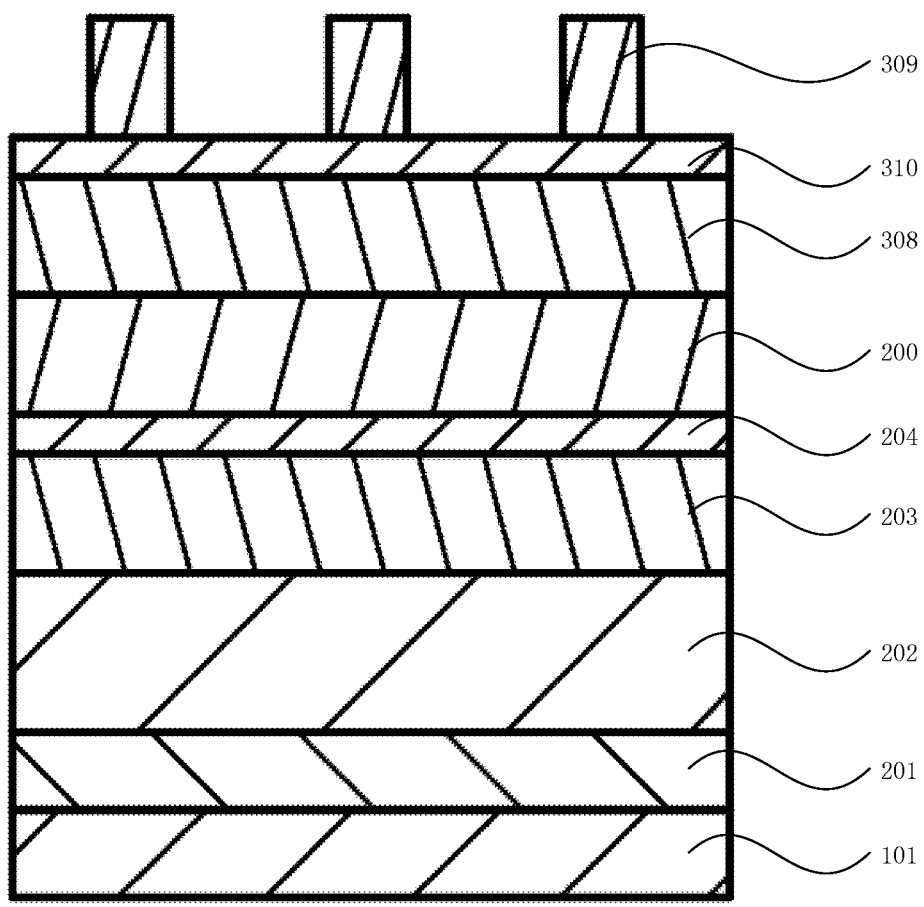
FIG. 5A is a schematic structure diagram after a photoresist on a storage region is patterned in an embodiment of the present application.
Figure 6A:
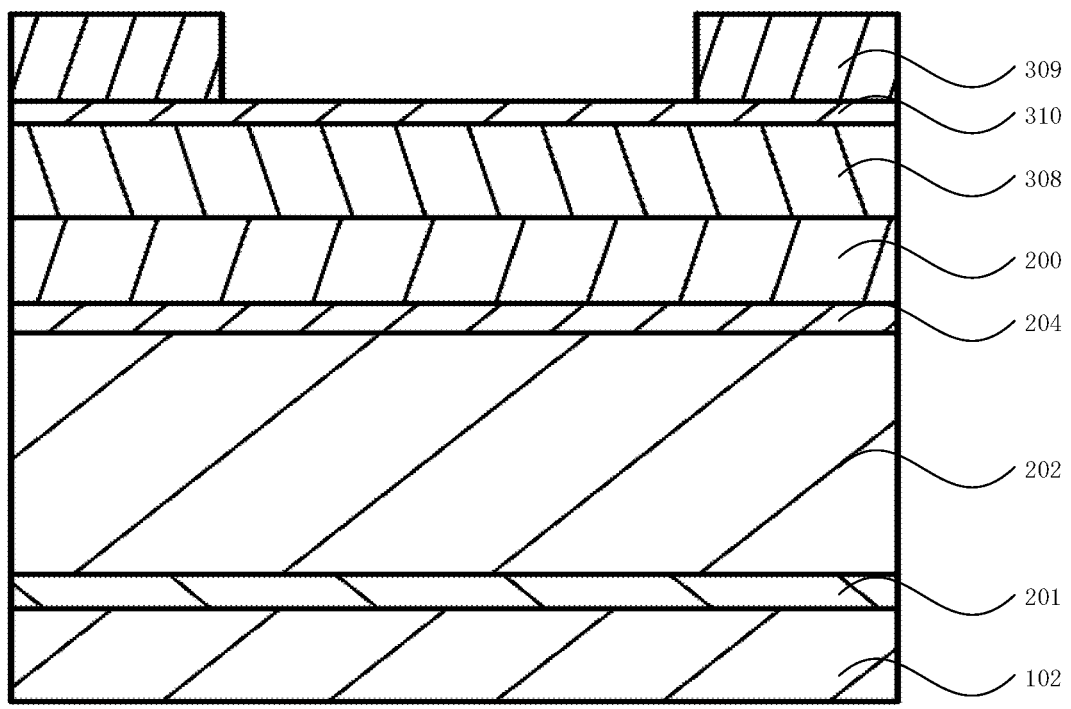
FIG. 6A is a schematic structure diagram after a photoresist on a test region is patterned in an embodiment of the present application.
Figure 7A:
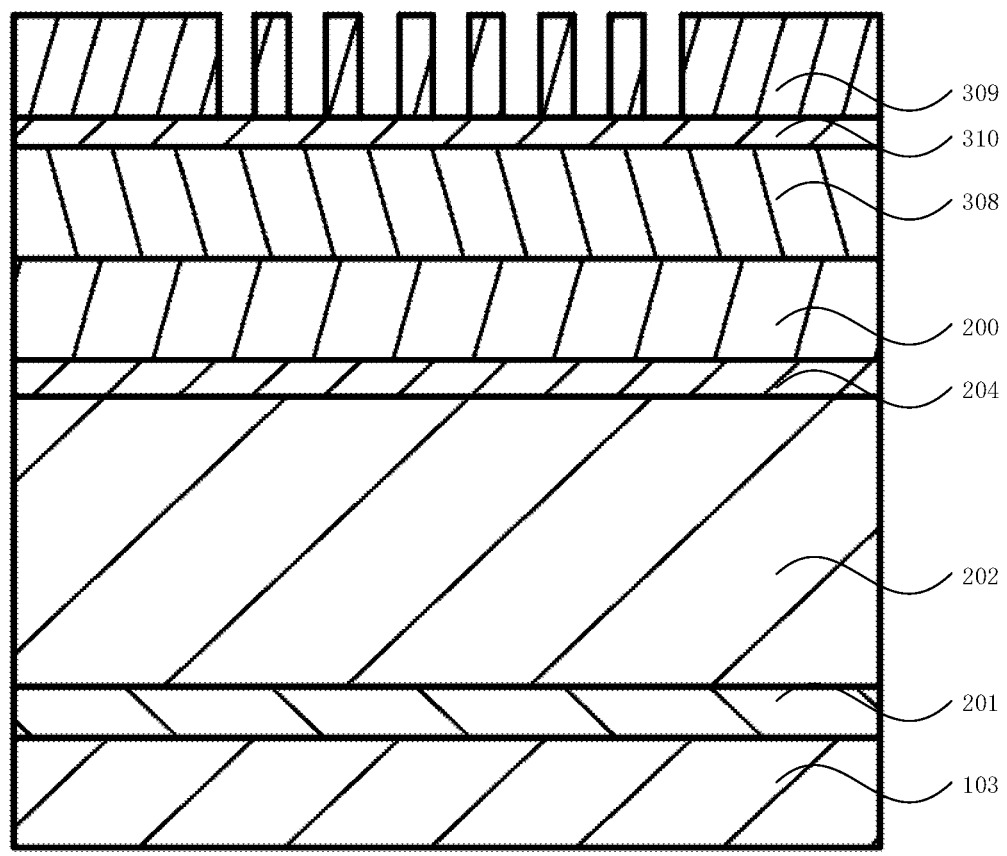
FIG. 7A is a schematic structure diagram after a photoresist on an alignment region is patterned in an embodiment of the present application.

An embodiment of the present application provides a manufacturing method for memory, which is used for manufacturing a memory, for example, for manufacturing a dynamic random access memory. Referring to FIG. 4A, the manufacturing method includes the following steps:

Step S1: a substrate 100 is provided. The material of the substrate 100 may be a material for the semiconductor substrate 100 that is well known to those skilled in the art, such as silicon or germanium. The substrate 100 includes a first functional region and a second functional region. The first functional region may be, for example, a storage region 101. A semiconductor structure formed on the storage region 101 is used for charge storage and charge release. The second functional region may be, for example, a peripheral circuit region. The second functional region includes a test region 102 and an alignment region 103. A semiconductor structure formed on the test region 102 is used for electrical testing of the semiconductor structure formed on the storage region 101 during the manufacturing process. A semiconductor structure formed on the alignment region 103 is used to align the semiconductor structures formed on the storage region 101 and the test region 102 during exposure. The structure formed in this step may be referred to FIGS. 5A, 6A and 7A.

A plurality of storage regions 101 may be formed on the substrate 100, cutting regions that separate the plurality of storage regions 101 are further formed on the substrate 100, and the cutting regions are used to cut the substrate 100 into the plurality of storage units after forming semiconductor structures on the substrate 100, and the alignment regions 103 are formed on the cutting regions. As such, after the substrate 100 is cut, the alignment regions 103 that hardly affect the performance of memory cells are destroyed, so the performance of the memory is good.

Step S2: a first isolation layer 200 is formed on the substrate 100. The material of the first isolation layer 200 includes but is not limited to silicon oxide. The first isolation layer 200 may be formed by chemical deposition. The structure formed in this step may be referred to FIGS. 5A, 6A and 7A. A metal tungsten layer 201 is arranged on the substrate 100 of the first functional region, an amorphous carbon layer 202 is arranged on the metal tungsten layer 201, a spin-on hard masks (SOH) layer 203 is arranged on the amorphous carbon layer 202, a silicon oxynitride layer 204 is arranged on the SOH layer 203, and the first isolation layer 200 is arranged on the silicon oxynitride layer 204. The metal tungsten layer 201 is arranged on the substrate 100 of the second functional region, the amorphous carbon layer 202 is arranged on the metal tungsten layer 201, the silicon oxynitride layer 204 is arranged on the amorphous carbon layer 202, and the first isolation layer 200 is arranged on the silicon oxynitride layer 204.

Figure 5B:
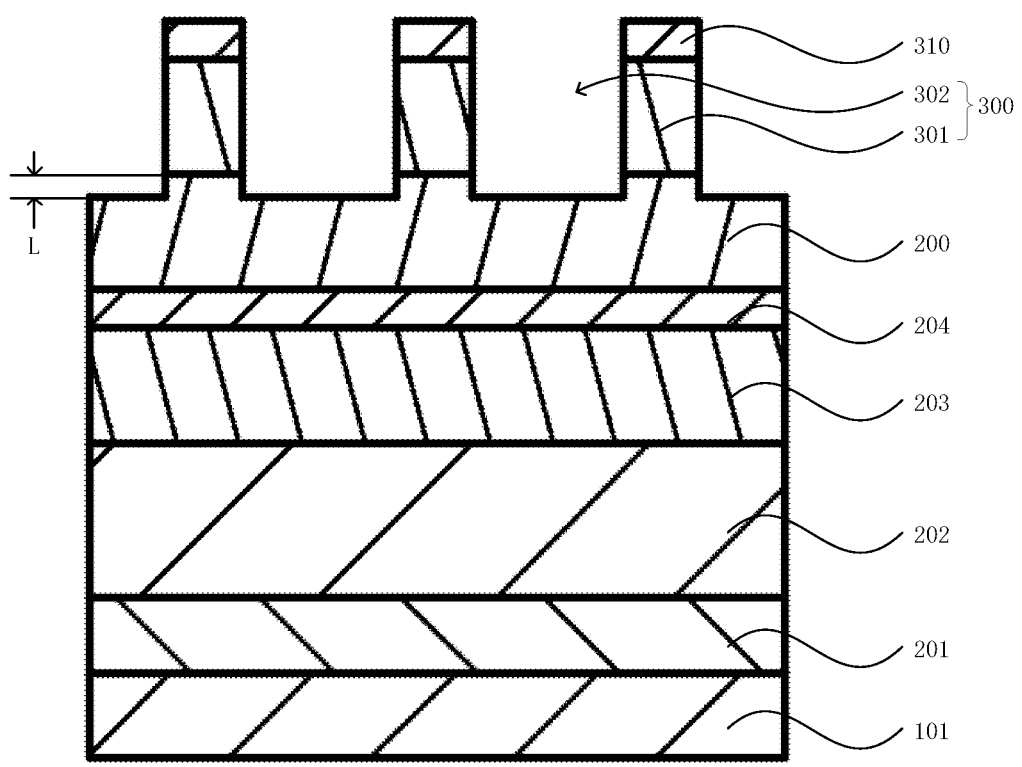
FIG. 5B is a schematic structure diagram illustrating that a first mask layer with pattern regions is arranged on the storage region in an embodiment of the present application.
Figure 6B:
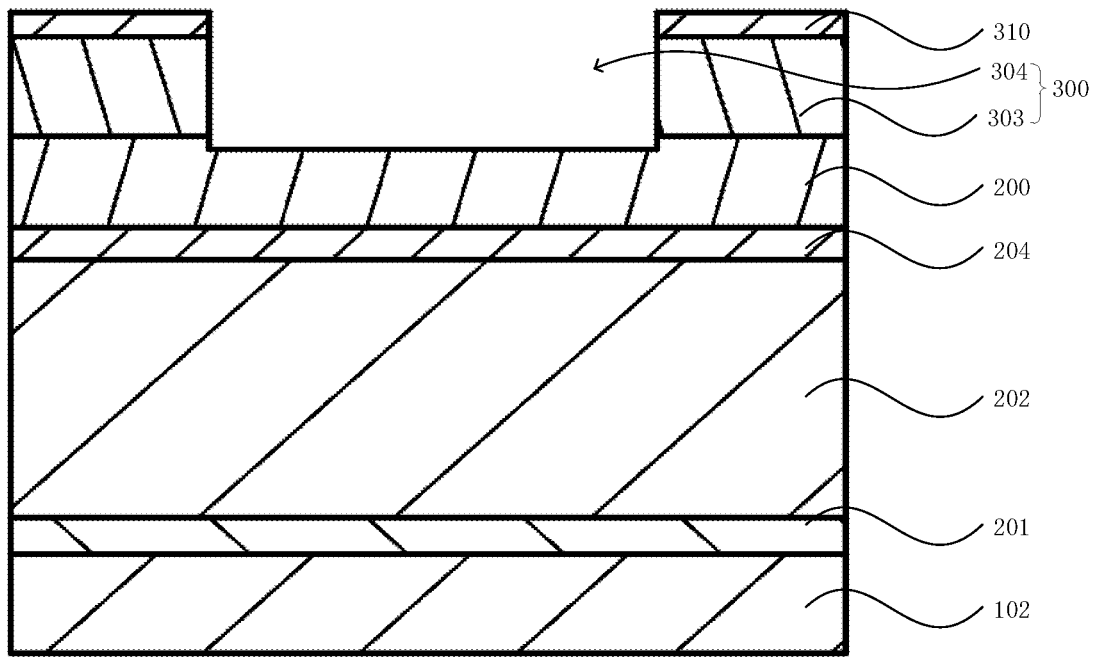
FIG. 6B is a schematic structure diagram illustrating that a first mask layer with pattern regions is arranged on the test region in an embodiment of the present application.
Figure 7B:
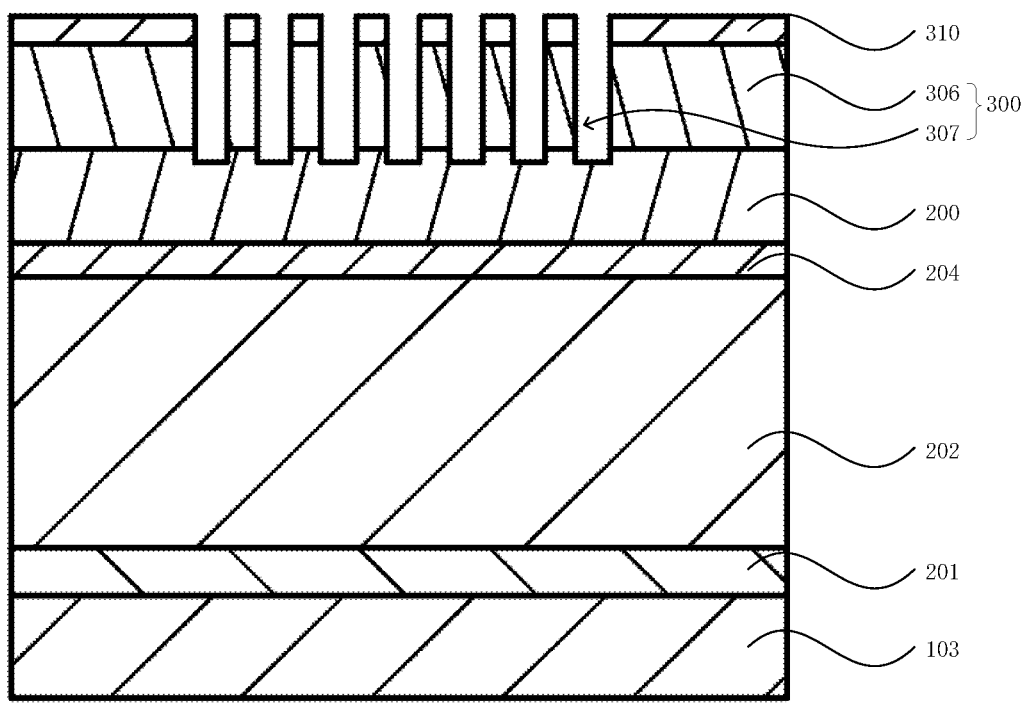
FIG. 7B is a schematic structure diagram illustrating that a first mask layer with pattern regions is arranged on the alignment region in an embodiment of the present application.

Step S3: a first mask layer 300 with pattern regions is formed on the first isolation layer 200, the pattern region includes a first pattern region corresponding to the first functional region and a second pattern region corresponding to the second functional region, the first pattern region includes a plurality of first mask walls and first trenches formed between the adjacent first mask walls, and the second pattern region includes a plurality of second mask walls and second trenches formed between the adjacent second mask walls. The structure formed in this step is shown in FIGS. 5B, 6B and 7B. The first mask layer 300 has a first pattern region and a second pattern region, the first pattern region is arranged on the first functional region, the first pattern region includes at least a plurality of first mask walls 301 and first trenches 302 between every two adjacent first mask walls 301, the second pattern region is arranged on the second functional region, and the second pattern region includes at least a plurality of second mask walls and second trenches between every two adjacent second mask walls.

The first mask layer 300 is, for example, a spin-on hard mask. The spin-on hard mask is a mask under a photoresist, and can serve as an appropriate defense mask in the subsequent etching process and help the transcription of a circuit to the target mask to achieve the accuracy of fine patterns.

Referring to FIGS. 6B, 4B, 4C and 7B, the second pattern region further includes a test pattern region corresponding to the test region 102 and an alignment pattern region corresponding to the alignment region 103, the test pattern region includes a plurality of test mask walls 303 and test trenches 304 formed between the adjacent test mask walls 303, at least one sub-pattern region 305 is formed in the alignment pattern region, and a plurality of sub-mask walls 306 arranged at intervals and sub-trenches 307 formed by every two adjacent sub-mask walls 306 are formed in each sub-pattern region 305. The test mask walls 303 and the sub-mask walls 306 together form the above-mentioned second mask walls, and the test trenches 304 and the sub-trench 307 together form the above-mentioned second trenches.

In the sub-pattern region 305, the width of the sub-trenches 307 is less than that of the test trenches 304, and the pattern density of the sub-trenches 307 on the sub-pattern region 305 is greater than that of the test trenches 304 on the test pattern region. The number of sub-pattern regions 305 is four, each sub-pattern region 305 is rectangular, and the four sub-pattern regions 305 are arranged in a matrix of two rows and two columns, and the four sub-pattern regions are rotationally symmetrical around the center of the matrix of the four sub-pattern regions 305.

Figure 4D:
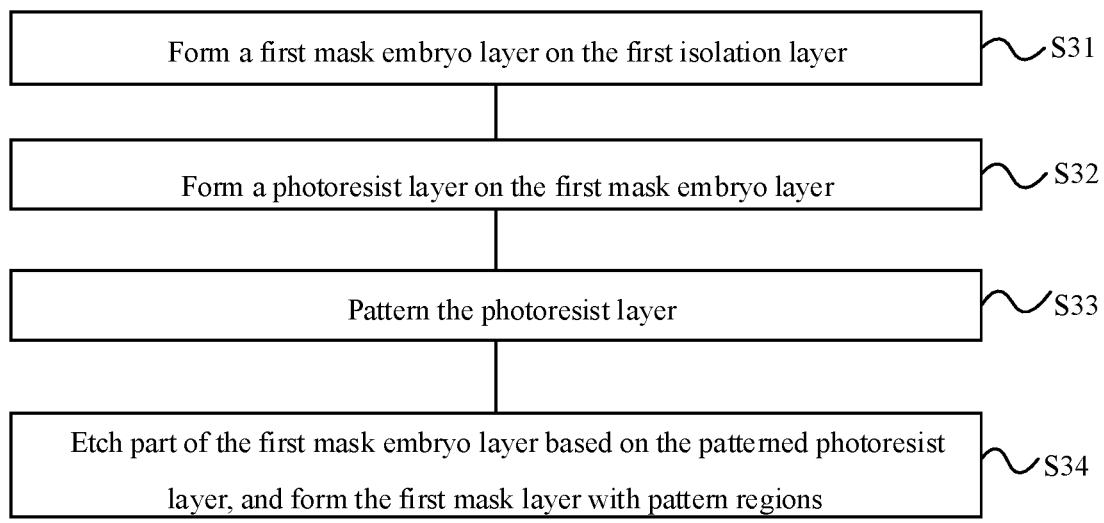
FIG. 4D is a flowchart of a method for manufacturing a first mask layer in an embodiment of the present application.

Referring to FIG. 4D, the step of forming a first mask layer 300 with pattern regions on the first isolation layer 200 includes:

Step S31: a first mask embryo layer is formed on the first isolation layer 200. The first mask embryo layer may be a spin-on hard mask. The structure formed in this step is referred to FIGS. 5A, 6A and 7A. The first mask embryo layer 308 is arranged on the first isolation layer 200.

Step S32: a photoresist layer is formed on the first mask embryo layer 308. The structure formed in this step is referred to FIGS. 5A, 6A and 7A. The photoresist layer 309 is arranged on the first mask embryo layer 308.

Step S33: the photoresist layer 309 is patterned. The structure formed in this step is referred to FIGS. 5A, 6A and 7A. A plurality of photoresist walls are formed on the photoresist layer 309, and gaps are formed between every two adjacent photoresist walls.

Step S34: part of the first mask embryo layer 308 is etched based on the patterned photoresist layer 309, and the first mask layer 300 with pattern regions is formed. The structure formed by this step is shown in FIGS. 5B, 6B and 7B. The first mask layer 300 has a first pattern region and a second pattern region, the first pattern region is arranged on the first functional region, the first pattern region includes a plurality of first mask walls 301 and first trenches 302 between every two adjacent first mask walls 301, the second pattern region further includes a test pattern region corresponding to the test region 102 and an alignment pattern region corresponding to the alignment region 103, the test pattern region includes a plurality of test mask walls 303 and test trenches 304 formed between the adjacent test mask walls 303, at least one sub-pattern region 305 is formed in the alignment pattern region, and a plurality of sub-mask walls 306 arranged at intervals and sub-trenches 307 formed by every two adjacent sub-mask walls 306 are formed in each sub-pattern region 305.

After the first mask embryo layer 308 is formed on the first isolation layer 200 and before the photoresist layer 309 is arranged on the first mask embryo layer 308, the method further includes: forming a dielectric anti-reflective coating on the first mask embryo layer 308. The dielectric anti-reflective coating is a thin dielectric coating used to reduce the reflectivity of the surface to light in a certain wavelength range. The material of the dielectric anti-reflective coating includes but is not limited to silicon oxynitride. The structure formed in this step is referred to FIGS. 5A, 6A and 7A. The dielectric anti-reflective coating 310 is arranged on the first mask embryo layer 308, and the photoresist layer 309 is arranged on the dielectric anti-reflective coating 310.

Step S4: a second isolation layer 400 is formed on the first mask layer 300 and on the first isolation layer 200 exposed in the first trenches 302 and the second trenches, the second isolation layer 400 forming third trenches in the first trenches 302 and fourth trenches in the second trenches. The material of the second isolation layer 400 may be the same as that of the first isolation layer 200, the material of the second isolation layer 400 may be silicon oxide, the second isolation layer 400 may be formed by atomic layer deposition, the deposition thickness of the second isolation layer 400 is less than half of the width of the first trenches 302 and half of the width of the second trenches, then the third trenches are formed in the first trenches 302, and the fourth trenches are formed in the second trenches. The structure formed in this step is referred to FIGS. 5C, 6C and 7C. The second isolation layer 400 is arranged on the top and side surfaces of the first mask layer 300, and on the first isolation layer 200 exposed in the first trenches 302 and the second trenches.

Referring to FIGS. 5B, 6B and 7B, when part of the first mask embryo layer 308 is etched based on the patterned photoresist layer 309, the first isolation layer 200 within a set depth is also etched and removed, where the set depth is defined as L shown in FIG. 5B. When part of the first mask embryo layer 308 is etched, the first isolation layer 200 within a set depth is etched and removed, so that after the second isolation layer 400 is formed, the top surface of the first isolation layer 200 under the first mask walls 301 tends to be flush with the top surface of the second isolation layer 400 at the first trenches 302, the top surface of the first isolation layer 200 under the second mask walls tends to be flush with the top surface of the second isolation layer 400 at the second trenches, then the pattern structure of the manufactured memory is complete, and the performance of the memory is improved.

Figure 5C:
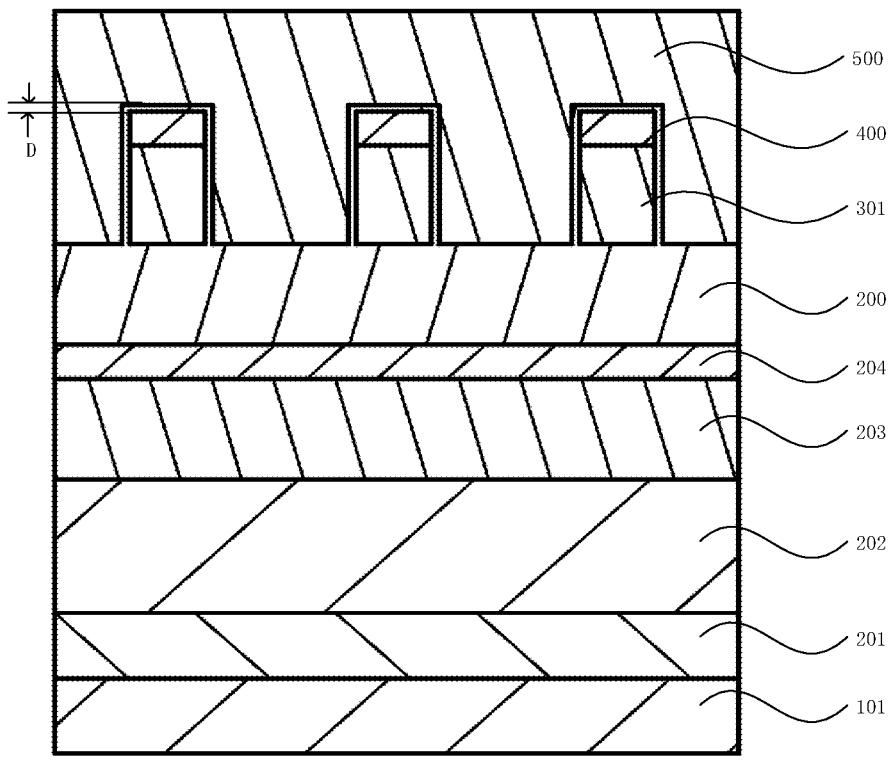
FIG. 5C is a schematic structure diagram illustrating that a second isolation layer and a second mask layer are disposed on the storage region in an embodiment of the present application.

Referring to FIGS. 5B and 5C, the set depth L is equal to the thickness D of the second isolation layer 400, so that after the second isolation layer 400 is formed, the top surface of the first isolation layer 200 under the first mask walls 301 is flush with the top surface of the second isolation layer 400 at the first trenches 302, the top surface of the first isolation layer 200 under the second mask walls is flush with the top surface of the second isolation layer 400 at the second trenches, then the pattern structure of the manufactured memory is complete, and the performance of the memory is improved.

Figure 6C:
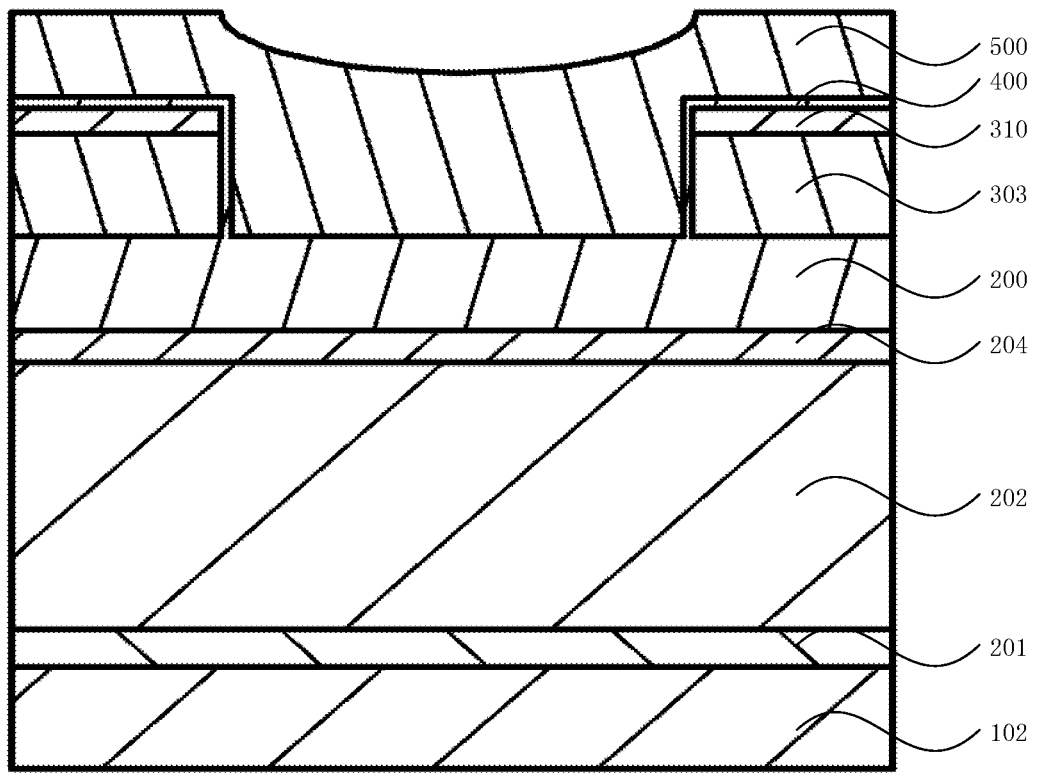
FIG. 6C is a schematic structure diagram illustrating that a second isolation layer and a second mask layer are disposed on the test region in an embodiment of the present application.
Figure 7C:
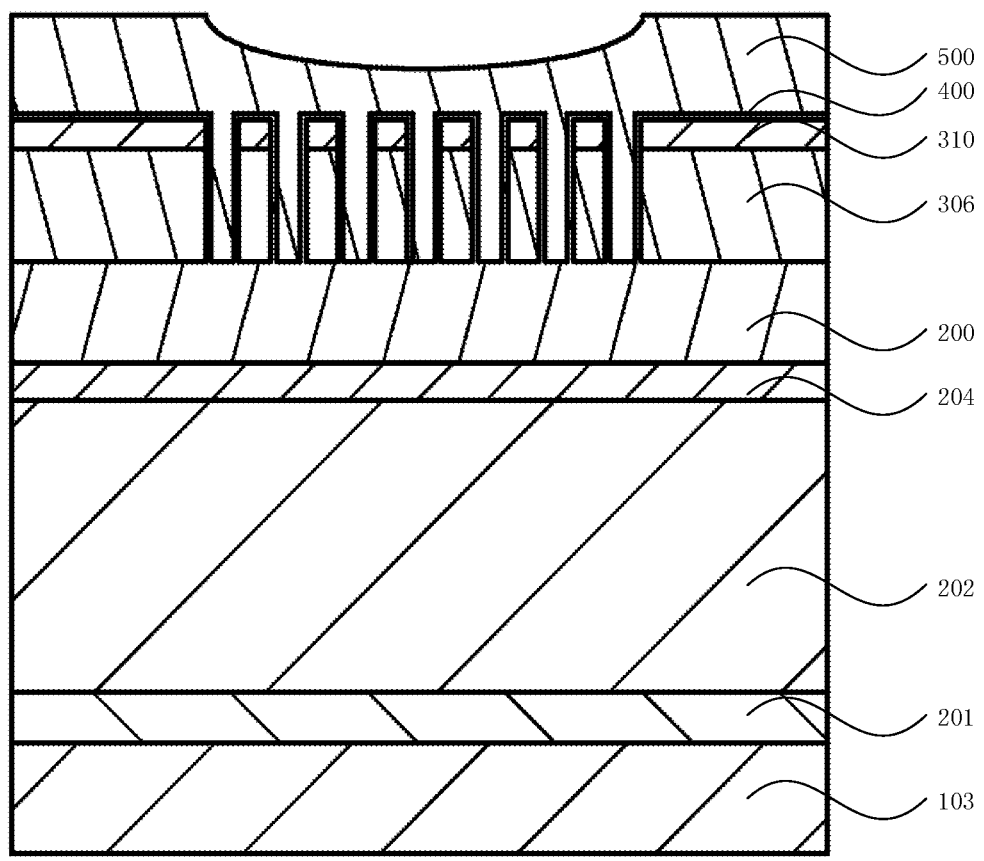
FIG. 7C is a schematic structure diagram illustrating that a second isolation layer and a second mask layer are disposed on the alignment region in an embodiment of the present application.

Step S5: a second mask layer 500 is formed on the second isolation layer 400. The second mask layer 500 may be a spin-on hard mask. The second mask layer 500 fills the third trenches and the fourth trenches, and the top surface of the second mask layer 500 is higher than that of the second isolation layer 400. The second mask layer 500 has a first recessed portion corresponding to the first pattern region and a second recessed portion corresponding to the second pattern region, wherein the recessed depth of the first recessed portion toward the substrate 100 is much less than the second recessed portion, and can even be ignored. The structure formed in this step is shown in FIGS. 5C, 6C and 7C. The second mask layer 500 is arranged on the second isolation layer 400, the second mask layer 500 fills the third trenches and the fourth trenches, and the top surface of the second mask layer 500 is higher than that of the second isolation layer 400.

Figure 5D:
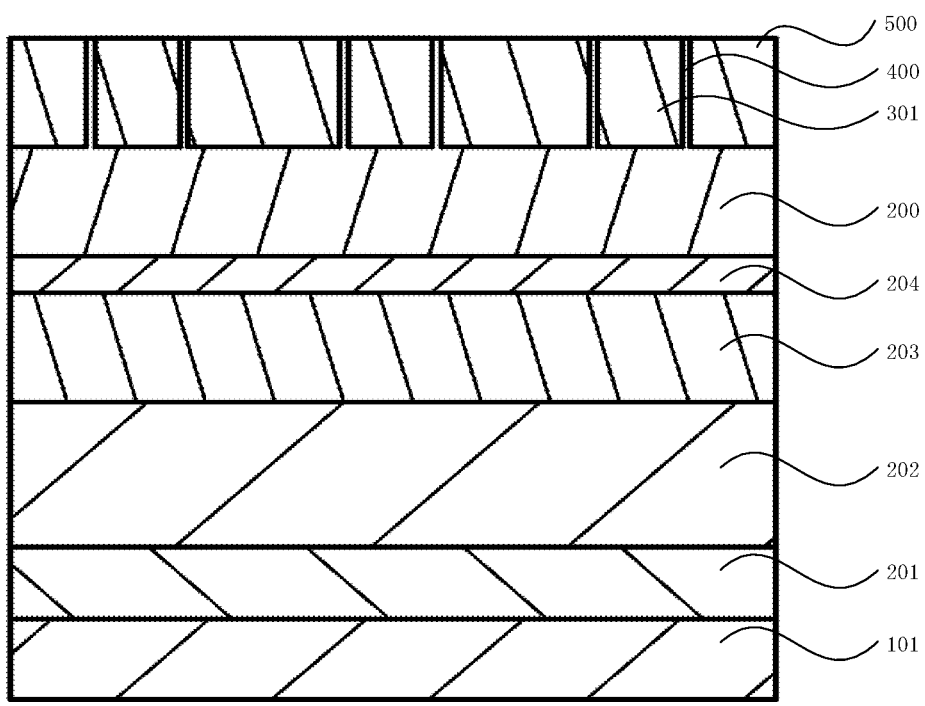
FIG. 5D is a schematic structure diagram illustrating that part of the second mask layer and the second isolation layer are removed from the storage region in an embodiment of the present application.
Figure 6D:
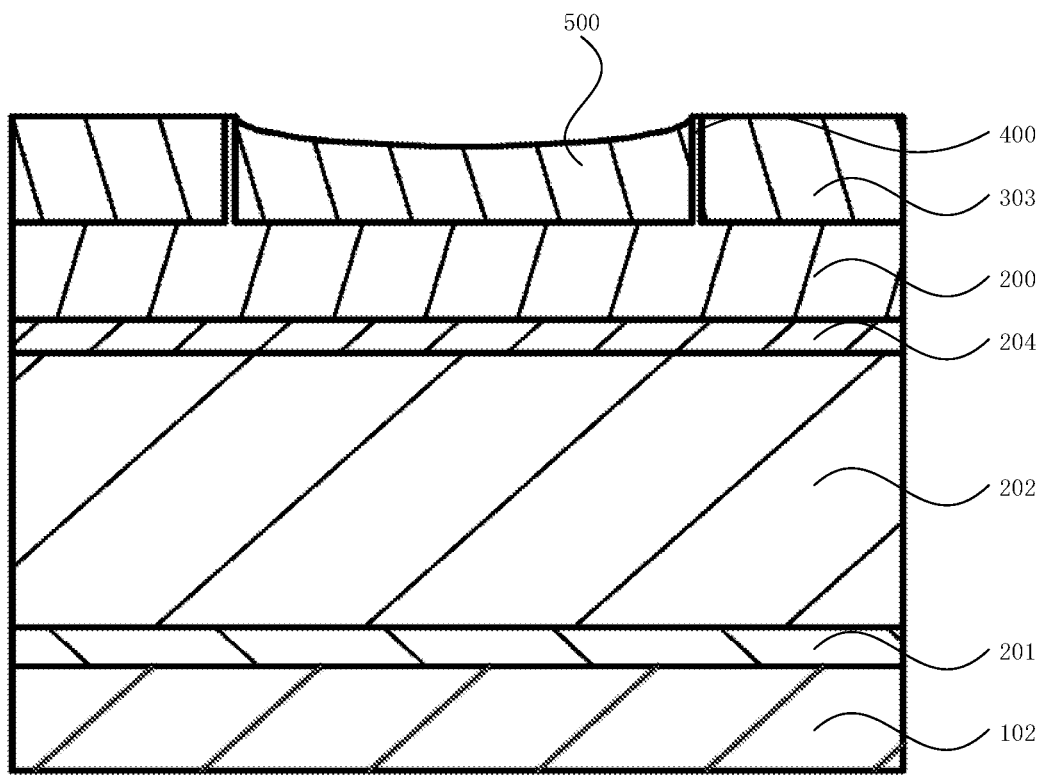
FIG. 6D is a schematic structure diagram illustrating that part of the second mask layer and the second isolation layer are removed from the test region in an embodiment of the present application.
Figure 7D:
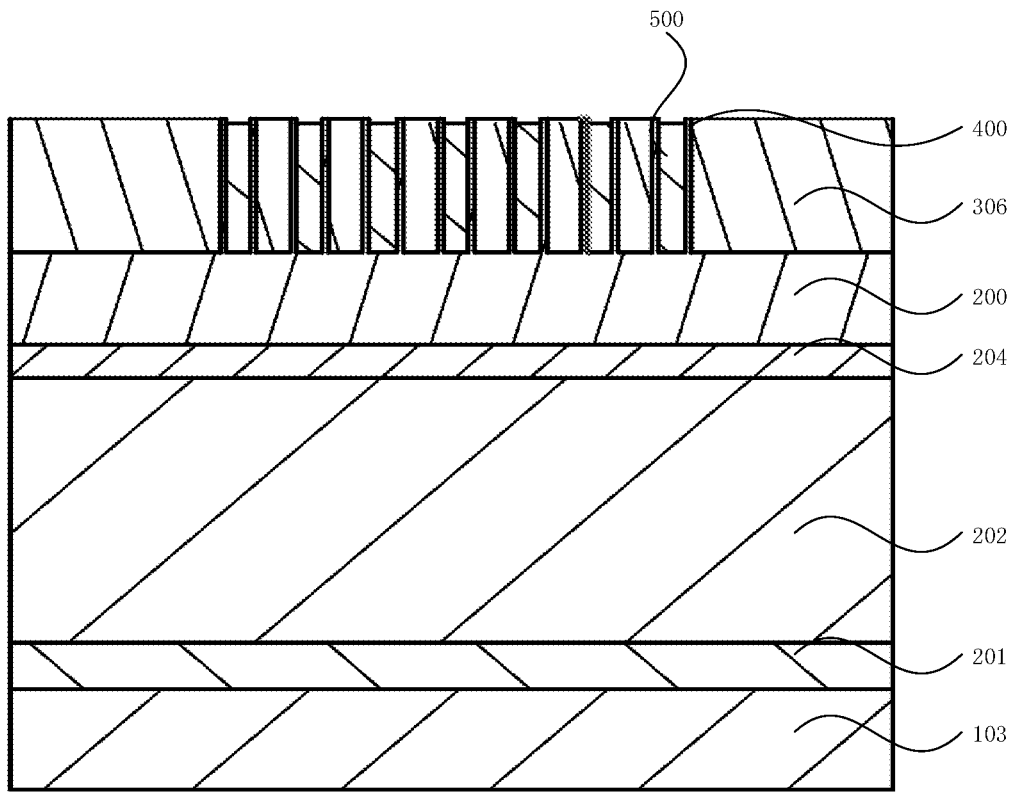
FIG. 7D is a schematic structure diagram illustrating that part of the second mask layer and the second isolation layer are removed from the alignment region in an embodiment of the present application.

Step S6: part of the second mask layer 500 and part of the second isolation layer 400 are removed, the top surface of the remaining second isolation layer 400 is flush with the top surface of the first mask layer 300, and the top surface of the remaining second mask layer 500 is equal to or smaller than the top surface of the first mask layer 300 and larger than the top surface of the first isolation layer 200. The structure formed in this step is shown in FIGS. 5D, 6D and 7D. The top surface of the second mask layer 500 is flush with the top surface of the first mask layer 300. The remaining second isolation layer 400, the remaining second mask layer 500 and the first mask layer 300 are of strip structures, and the strip structures formed by the remaining second isolation layer 400 are arranged between the strip structures formed by the remaining second mask layer 500 and the strip structures formed by the first mask layer 300.

Figure 5E:
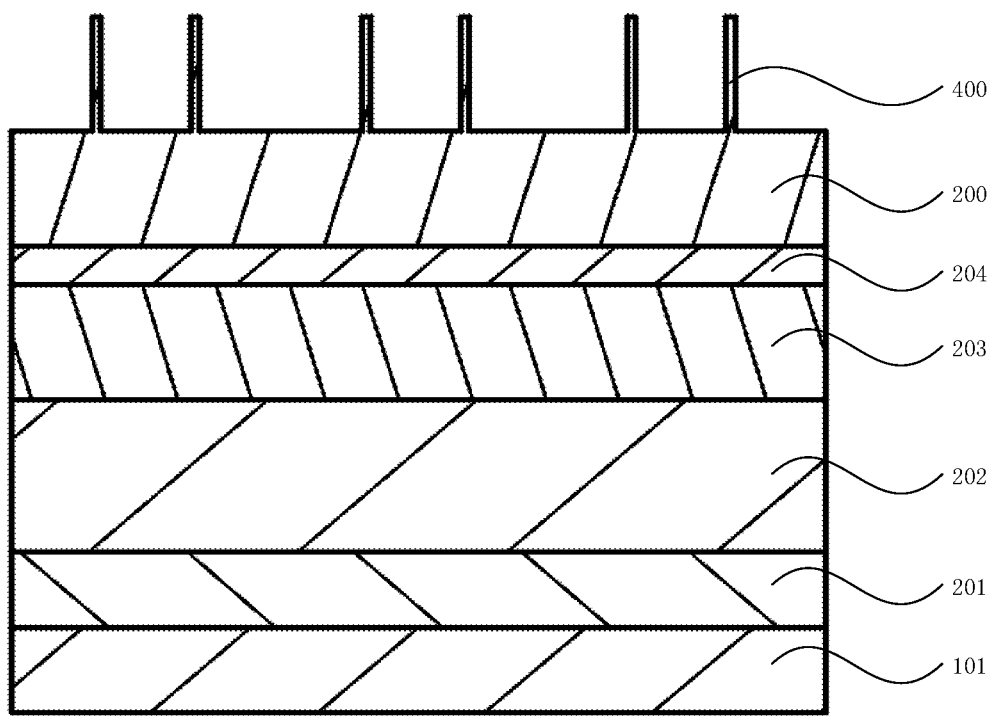
FIG. 5E is a schematic structure diagram illustrating that the remaining second mask layer and the first mask layer are removed from the storage region in an embodiment of the present application.
Figure 6E:
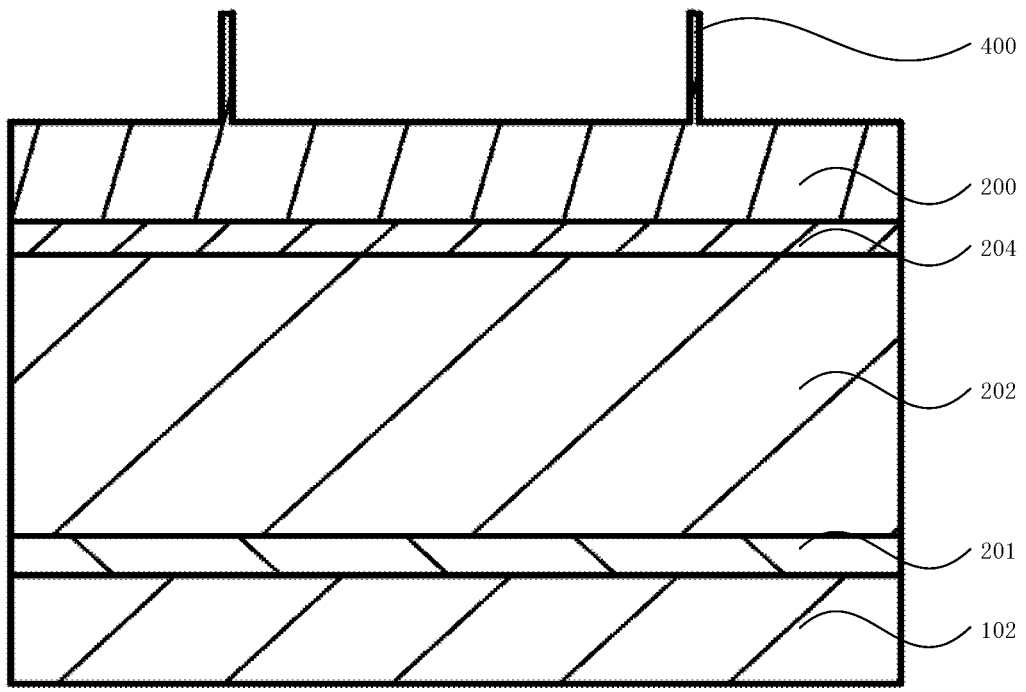
FIG. 6E is a schematic structure diagram illustrating that the remaining second mask layer and the first mask layer are removed from the test region in an embodiment of the present application.
Figure 7E:
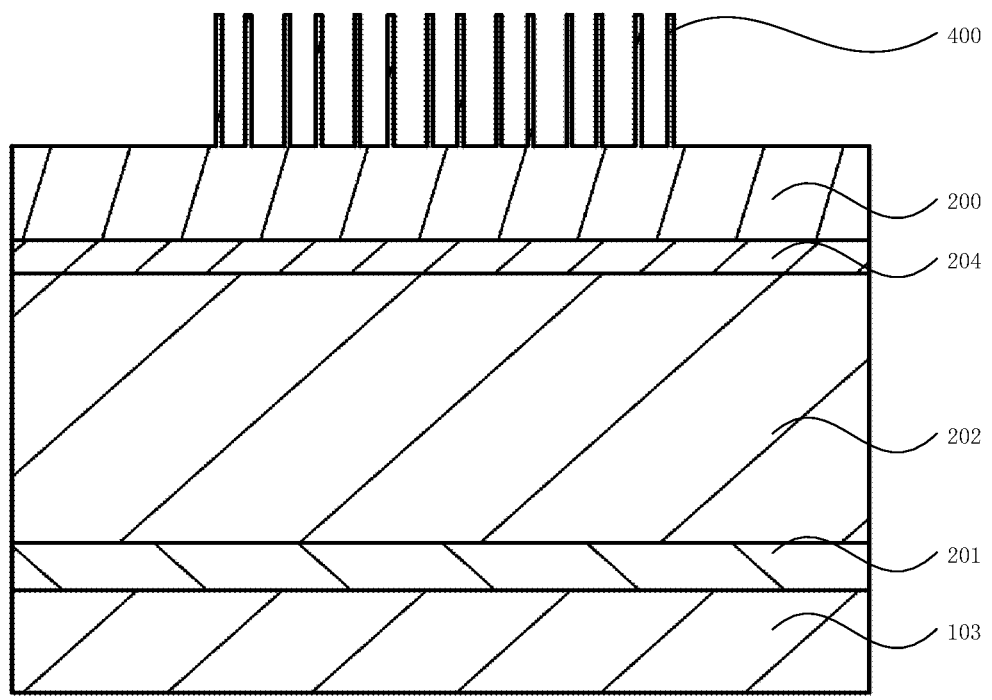
FIG. 7E is a schematic structure diagram illustrating that the remaining second mask layer and the first mask layer are removed from the alignment region in an embodiment of the present application.

Step S7: the first mask layer 300 and the remaining second mask layer 500 are removed. In this step, the first mask layer 300 and the remaining second mask layer 500 may be removed using oxygen plasma. This step does not etch the second isolation layer 400. The structure formed in this step is shown in FIGS. 5E, 6E and 7E. The remaining second isolation layer 400 is arranged on the first isolation layer 200.

Figure 5F:
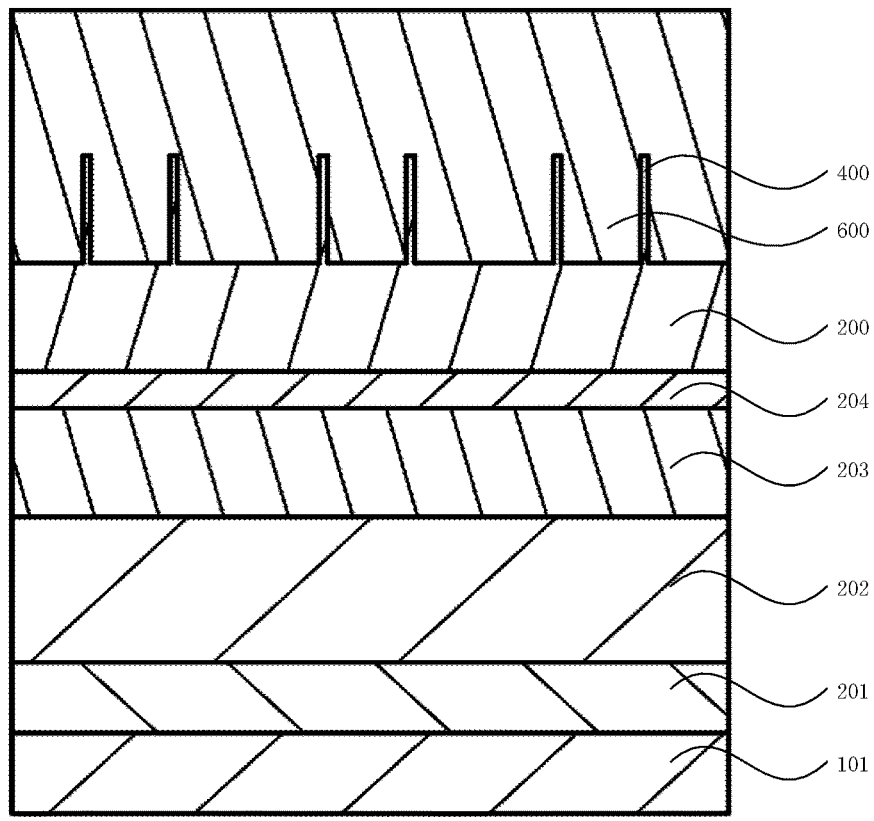
FIG. 5F is a schematic structure diagram illustrating that a third mask layer is arranged on the storage region in an embodiment of the present application.
Figure 6F:
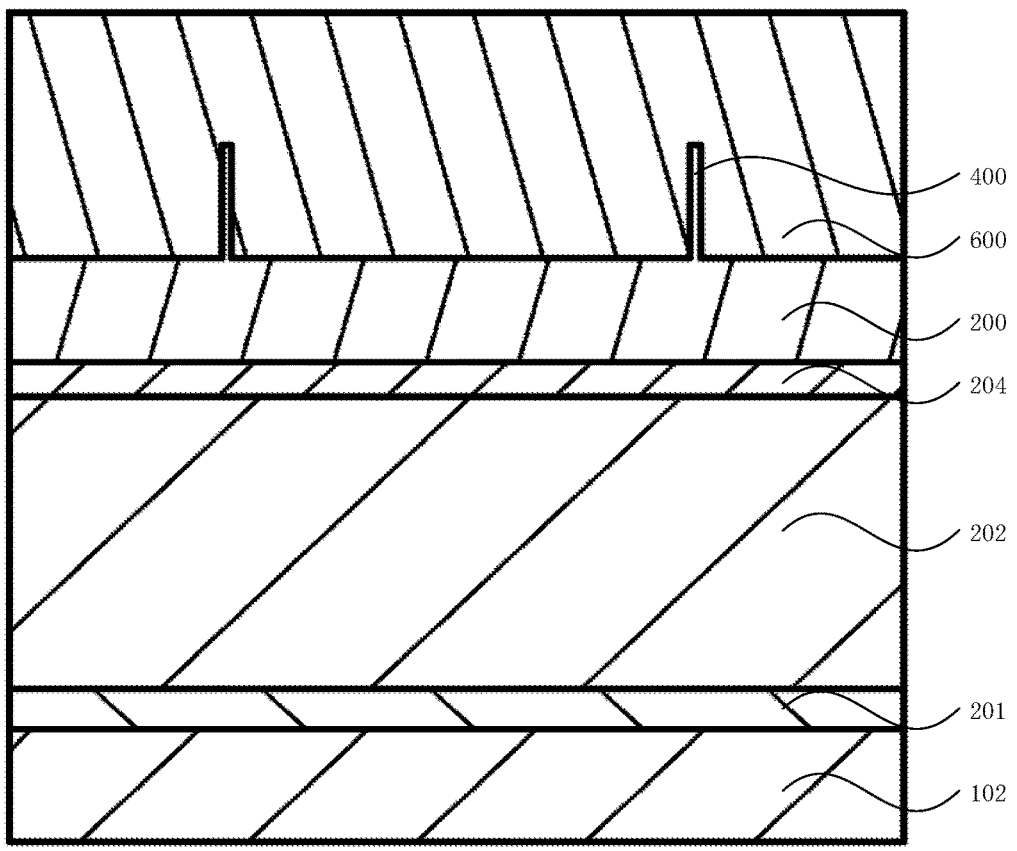
FIG. 6F is a schematic structure diagram illustrating that a third mask layer is arranged on the test region in an embodiment of the present application.
Figure 7F:
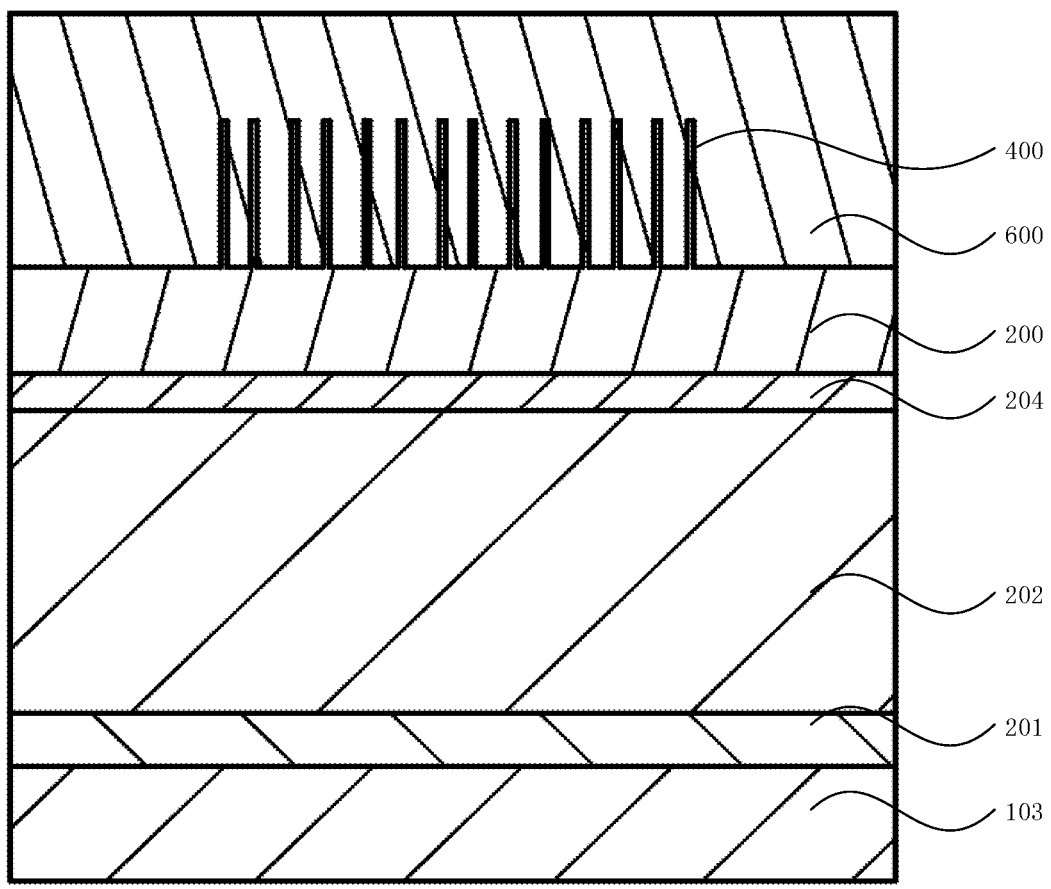
FIG. 7F is a schematic structure diagram illustrating that a third mask layer is arranged on the alignment region in an embodiment of the present application.

Step S8: a third mask layer is formed on the first isolation layer 200 and the remaining second isolation layer 400. The third mask layer may be, for example, a spin-on hard mask. The structure formed in this step is shown in FIGS. 5F, 6F and 7F. The third mask layer 600 fills the gaps between the strip structures formed by the remaining second isolation layer 400, and covers the remaining second isolation layer 400. The top surface of the third mask layer 600 corresponding to the first pattern region and the top surface thereof corresponding to the second pattern region are substantially planar.

Figure 5G:
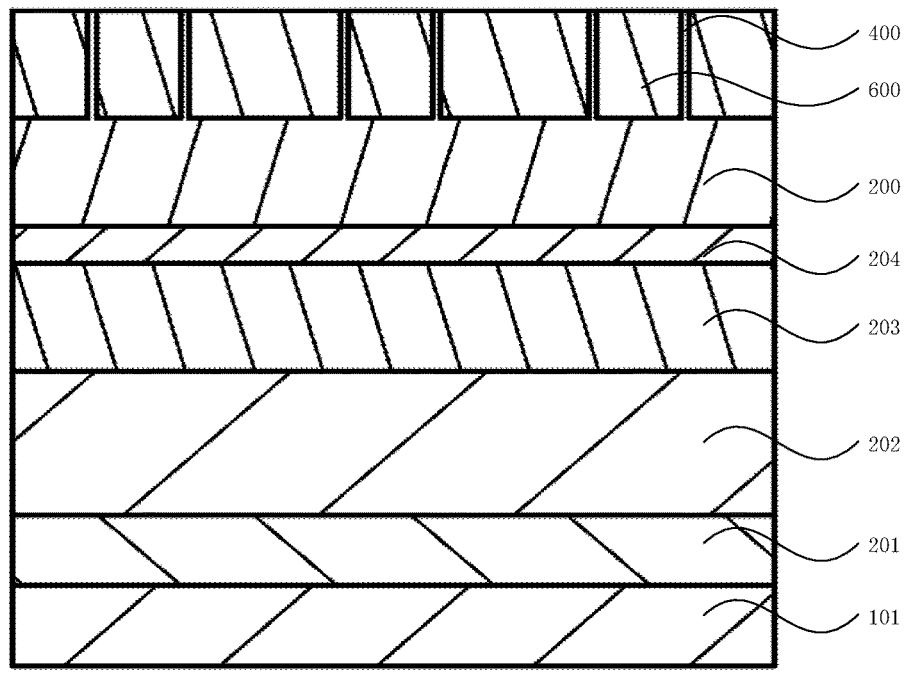
FIG. 5G is a schematic structure diagram illustrating that part of the third mask layer is removed from the storage region in an embodiment of the present application.
Figure 6G:
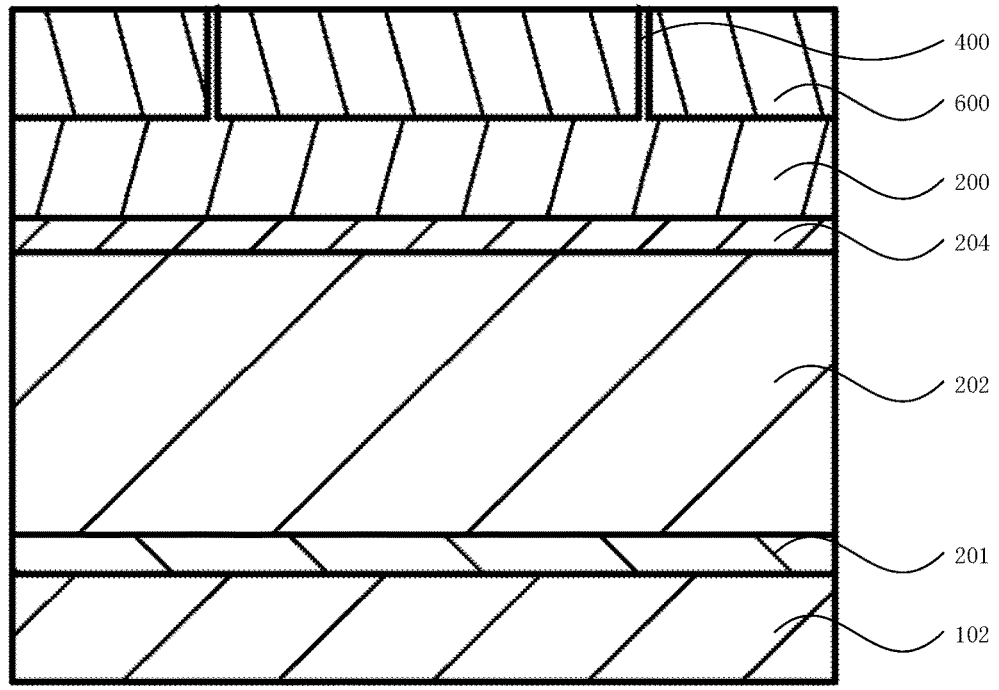
FIG. 6G is a schematic structure diagram illustrating that part of the third mask layer is removed from the test region in an embodiment of the present application.
Figure 7G:
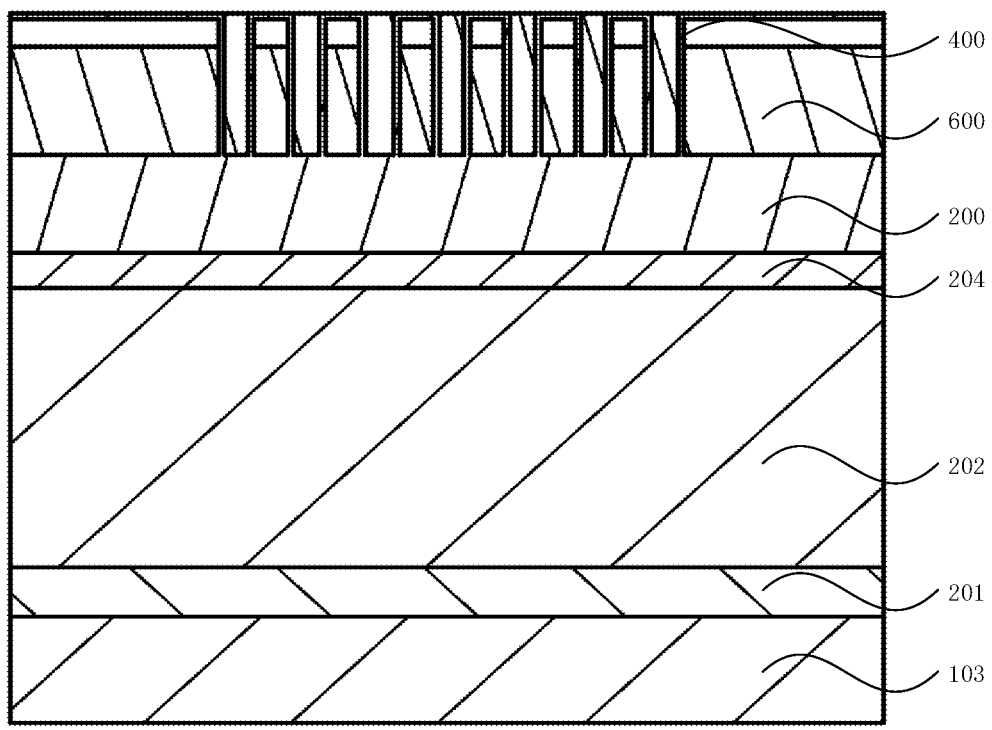
FIG. 7G is a schematic structure diagram illustrating that part of the third mask layer is removed from the alignment region in an embodiment of the present application.

Step S9: part of the third mask layer 600 is removed, the top surface of the remaining third mask layer 600 is flush with the top surface of the remaining second isolation layer 400. The structure formed in this step is shown in FIGS. 5G, 6G and 7G. The remaining third mask layer 600 is also of strip structures, the strip structures formed by the remaining third mask layer 600 and the strip structures formed by the remaining second isolation layer 400 are arranged at intervals and arranged on the first isolation layer 200, and top surfaces of the strip structures formed by the remaining third mask layer 600 are flush with top surfaces of the strip structures formed by the remaining second isolation layer 400.

Figure 5H:
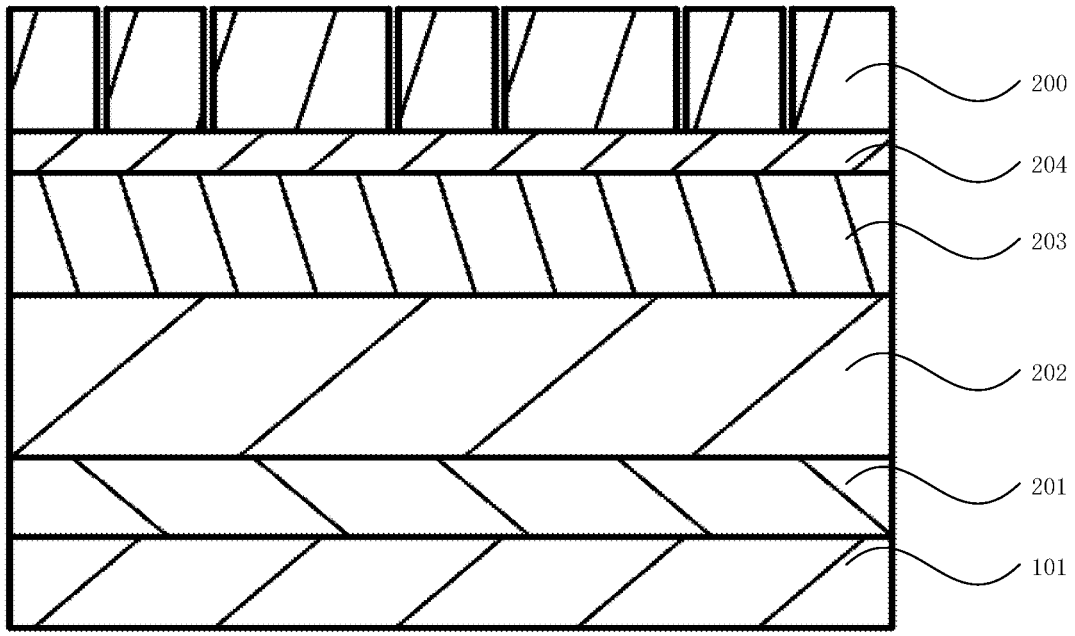
FIG. 5H is a schematic structure diagram illustrating that the remaining third mask layer, the remaining second isolation layer, and part of the first isolation layer are removed from the storage region in an embodiment of the present application.
Figure 6H:
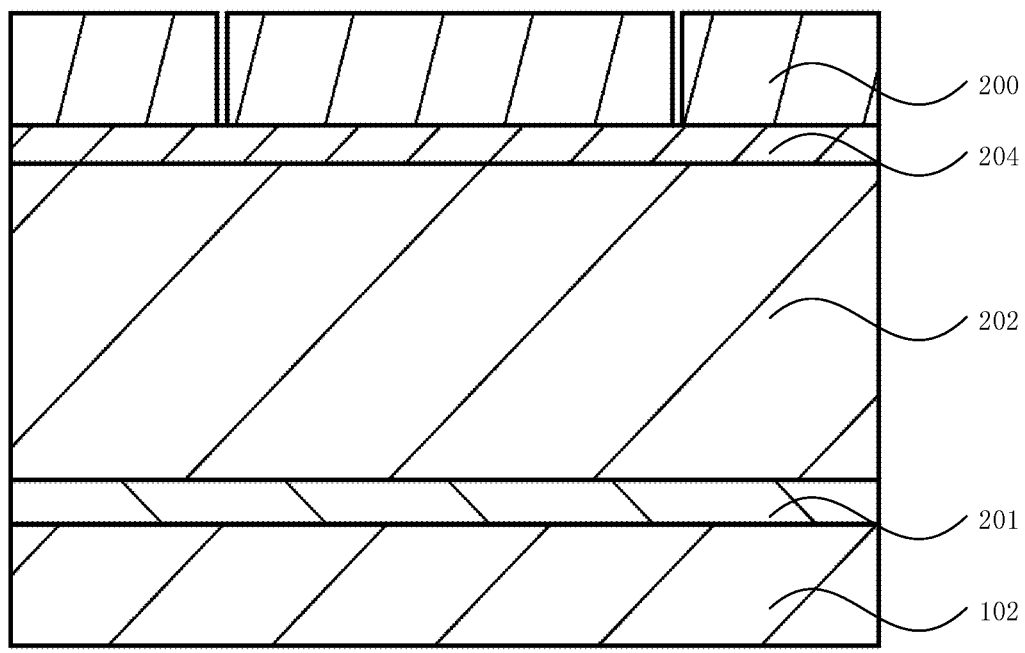
FIG. 6H is a schematic structure diagram illustrating that the remaining third mask layer, the remaining second isolation layer, and part of the first isolation layer are removed from the test region in an embodiment of the present application.
Figure 7H:
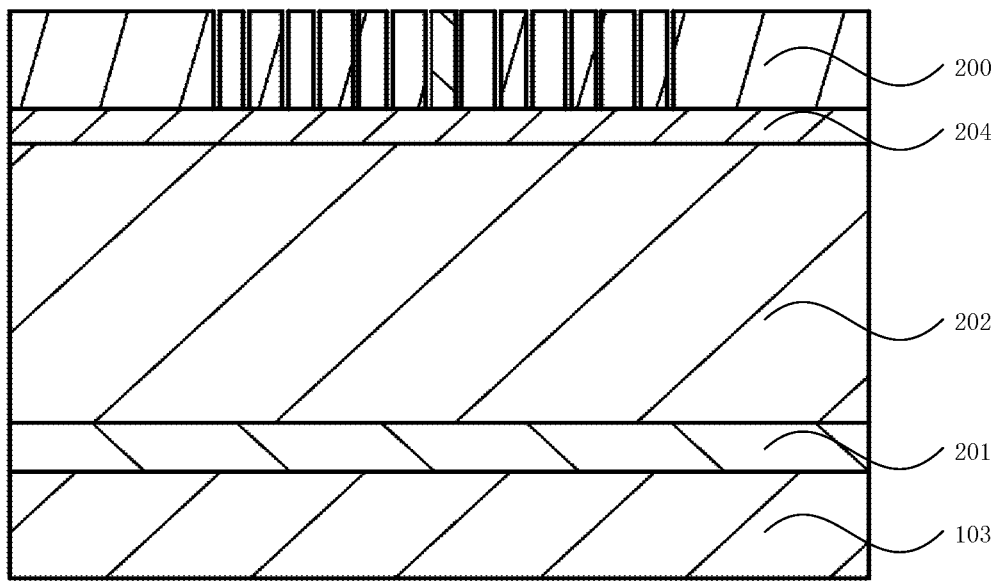
FIG. 7H is a schematic structure diagram illustrating that the remaining third mask layer, the remaining second isolation layer, and part of the first isolation layer are removed from the alignment region in an embodiment of the present application.

Step S10: the remaining part of the second isolation layer 400 and the first isolation layer 200 below the second isolation layer are etched, by taking the remaining third mask layer 600 as a mask, and a first functional pattern corresponding to the first functional region and a second functional pattern corresponding to the second functional region are formed. In this step, the remaining part of the second isolation layer 400 and the first isolation layer 200 below the second isolation layer are etched taking the remaining third mask layer 600 as a mask by means of plasma etching based on a mixed gas of hexafluorobutadiene and oxygen. When the plasma etching is carried out using the mixed gas of hexafluorobutadiene and oxygen, the third mask layer 600 is removed at the same time. The structure formed in this step is shown in FIGS. 5H, 6H and 7H. The first isolation layer 200 is also of strip structures.

In the manufacturing method for memory according to the embodiments of the present application, a first isolation layer 200 is formed on a substrate 100, a first mask layer 300 having first trenches 302 and second trenches is formed on the first isolation layer, a second isolation layer 400 is formed on the first mask layer 300 and the first isolation layer 200 that is not covered by the first mask layer 300, the second isolation layer 400 forms third trenches in the corresponding first trenches 302 and fourth trenches in the corresponding second trenches, a second mask layer 500 is formed on the second isolation layer 400 in the third trenches and the fourth trenches, then part of the second mask layer 500 and part of the second isolation layer 400 are removed, the first mask layer 300 and the remaining second mask layer 500 are removed, a third mask layer 600 is formed on the first isolation layer 200 and the second isolation layer 400, part of the third mask layer 600 is removed such that the top surface of the third mask layer 600 is flush with the top surface of the remaining second isolation layer 400, and the remaining second isolation layer 400 and the first isolation layer 200 below the second isolation layer are etched taking the remaining third mask layer 600 as a mask, and a first functional pattern and a second functional pattern with complete pattern structures on the first isolation layer 200 are formed, wherein the first functional pattern and the second functional pattern are not over-etched, and the etching depths of the first functional region and the second functional region are relatively uniform, thereby improving the performance of the memory.

In the manufacturing method for memory according to the embodiments of the present application, the semiconductor structures on the test region 102, the alignment region 103 and the storage region 101 are all formed in one step. From FIGS. 4B and 4C, it can be seen that there are a large number of blank regions on peripheries of the test region 102 and the alignment region 103. As such, the semiconductor structure manufactured by the manufacturing method for memory in related technologies has structural defects, while in the manufacturing method for memory according to the embodiments of the present application, strip structures of the second isolation layer 400 are formed firstly, and then a more complete semiconductor structure is formed by the third mask layer 600. This is because, when the second mask layer 500 is formed, there are large-sized test trenches 304 on the test region 102 and a lot of small-sized sub-trenches 307 on the alignment region 103, but there are a large number of blank regions on the peripheries of the test region 102 and the alignment region 103; when the second mask layer 500 is formed, in order to fill the test trenches 304 and the sub-trenches 307, recesses are easily formed at the test trenches 304 and the sub-trenches 307; after the second mask layer 500 and the first mask layer 300 are removed, when the third mask layer 600 is formed on the second isolation layer 400 and the first isolation layer 200, there are no the blank regions on the peripheries of the test region 102 and the alignment region 103, the second isolation layer 400 formed on the first isolation layer 200 has a small lateral size, and the top surface of the third mask layer 600 formed is flatter, so that when the first isolation layer 200 is etched by the remaining third mask layer 600, the pattern structure formed on the first isolation layer 200 is more complete, and when the metal tungsten layer 201 is further treated by the pattern later, the pattern on the first isolation layer 200 can also be transferred to the metal tungsten layer 201 correctly.

Finally, it should be noted that the above embodiments are merely intended to describe, but not to limit, the technical solutions of the present application. Although the present application is described in detail with reference to the above embodiments, those of ordinary skill in the art should understand that various modifications may be made to the technical solutions described in the foregoing embodiments or equivalent substitutions may be made to some or all technical features thereof, and these modifications or substitutions do not make the essences of the corresponding technical solutions depart from the scope of the technical solutions of the embodiments of the present application.

What is claimed is:

1. A manufacturing method for memory, comprising the following steps:
   providing a substrate, the substrate comprising a first functional region and a second functional region;
   forming a first isolation layer on the substrate;
   forming a first mask layer with pattern regions on the first isolation layer, the pattern region comprising a first pattern region corresponding to the first functional region and a second pattern region corresponding to the second functional region, the first pattern region comprising a plurality of first mask walls and first trenches formed between the adjacent first mask walls, and the second pattern region comprising a plurality of second mask walls and second trenches formed between the adjacent second mask walls;
   forming a second isolation layer on the first mask layer and on the first isolation layer exposed in the first trenches and the second trenches, the second isolation layer forming third trenches in the first trenches and fourth trenches in the second trenches;
   forming a second mask layer on the second isolation layer, the second mask layer filling the third trenches and the fourth trenches and covering a top surface of the second isolation layer, and the second mask layer having a first recessed portion corresponding to the first pattern region and a second recessed portion corresponding to the second pattern region;
   removing part of the second mask layer and part of the second isolation layer, a top surface of a remaining second isolation layer being flush with a top surface of the first mask layer, and a top surface of the remaining second mask layer being equal to or smaller than the top surface of the first mask layer and larger than a top surface of the first isolation layer;
   removing the first mask layer and the remaining second mask layer;
   forming a third mask layer on the first isolation layer and the remaining second isolation layer;
   removing part of the third mask layer, a top surface of a remaining third mask layer being flush with the top surface of the remaining second isolation layer; and
   etching the remaining part of the second isolation layer and the first isolation layer below the second isolation layer, by taking the remaining third mask layer as a mask; and forming a first functional pattern corresponding to the first functional region and a second functional pattern corresponding to the second functional region.

2. The manufacturing method for memory according to claim 1, wherein the step of forming a first mask layer with pattern regions on the first isolation layer comprises:
   forming a first mask embryo layer on the first isolation layer;
   forming a photoresist layer on the first mask embryo layer;
   patterning the photoresist layer; and
   etching part of the first mask embryo layer based on the patterned photoresist layer, and forming a first mask layer with pattern regions.

3. The manufacturing method for memory according to claim 2, wherein when part of the first mask embryo layer is etched based on the patterned photoresist layer, a first isolation layer within a set depth is also etched and removed, the set depth is defined as L.

4. The manufacturing method for memory according to claim 3, wherein the set depth L is equal to a thickness D of the second isolation layer.

5. The manufacturing method for memory according to claim 2, wherein after forming a first mask embryo layer on the first isolation layer and before arranging the photoresist layer on the first mask embryo layer, the manufacturing method for memory further comprises:
   forming a dielectric anti-reflective coating on the first mask embryo layer.

6. The manufacturing method for memory according to claim 5, wherein the material of the dielectric anti-reflective coating is silicon oxynitride.

7. The manufacturing method for memory according to claim 2, wherein the first functional region comprises a storage region, and a semiconductor structure formed on the storage region is used for charge storage and charge release.

8. The manufacturing method for memory according to claim 7, wherein the second functional region comprises a test region, and a semiconductor structure formed on the test region is used for electrical testing of the semiconductor structure formed on the storage region during the manufacturing process.

9. The manufacturing method for memory according to claim 8, wherein the second pattern region comprises a test pattern region corresponding to the test region, and the test pattern region comprises a plurality of test mask walls and test trenches formed between the adjacent test mask walls.

10. The manufacturing method for memory according to claim 9, wherein the second functional region further comprises an alignment region, and a semiconductor structure formed on the alignment region is used to align the semiconductor structures formed on the storage region and the test region during exposure.

11. The manufacturing method for memory according to claim 10, wherein the second pattern region further comprises an alignment pattern region corresponding to the alignment region, at least one sub-pattern region is formed in the alignment pattern region, a plurality of sub-mask walls arranged at intervals and sub-trenches formed by every two adjacent sub-mask walls are formed in each sub-pattern region, a width of the sub-trenches is less than a width of the test trenches, and a pattern density of the sub-trenches on the sub-pattern region is greater than a pattern density of the test trenches on the test pattern region.

12. The manufacturing method for memory according to claim 1, wherein the first mask layer and the remaining second mask layer are removed by oxygen plasma etching.

13. The manufacturing method for memory according to claim 1, wherein the first functional region comprises a storage region, and a semiconductor structure formed on the storage region is used for charge storage and charge release.

14. The manufacturing method for memory according to claim 13, wherein the second functional region comprises a test region, and a semiconductor structure formed on the test region is used for electrical testing of the semiconductor structure formed on the storage region during the manufacturing process.

15. The manufacturing method for memory according to claim 14, wherein the second pattern region comprises a test pattern region corresponding to the test region, and the test pattern region comprises a plurality of test mask walls and test trenches formed between the adjacent test mask walls.

16. The manufacturing method for memory according to claim 15, wherein the second functional region further comprises an alignment region, and a semiconductor structure formed on the alignment region is used to align the semiconductor structures formed on the storage region and the test region during exposure.

17. The manufacturing method for memory according to claim 16, wherein the second pattern region further comprises an alignment pattern region corresponding to the alignment region, at least one sub-pattern region is formed in the alignment pattern region, a plurality of sub-mask walls arranged at intervals and sub-trenches formed by every two adjacent sub-mask walls are formed in each sub-pattern region, a width of the sub-trenches is less than a width of the test trenches, and a pattern density of the sub-trenches on the sub-pattern region is greater than a pattern density of the test trenches on the test pattern region.

18. The manufacturing method for memory according to claim 17, wherein the number of sub-pattern regions is four, each sub-pattern region is rectangular, and the four sub-pattern regions are arranged in a matrix of two rows and two columns, and the four sub-pattern regions are rotationally symmetrical around a center of the matrix of the four sub-pattern regions.

19. The manufacturing method for memory according to claim 16, wherein a plurality of storage regions are formed on the substrate;

cutting regions for separating the plurality of storage regions are further formed on the substrate, and the cutting regions are used to cut the substrate into a plurality of storage units after forming semiconductor structures on the substrate; and the alignment regions are formed on the cutting regions.

20. The manufacturing method for memory according to claim 1, wherein the remaining part of the second isolation layer and the first isolation layer below the second isolation layer are etched taking the remaining third mask layer as a mask, by means of plasma etching based on a mixed gas of hexafluorobutadiene and oxygen.

\* \* \* \* \*